(12) United States Patent
Huang

(10) Patent No.: US 12,113,028 B2
(45) Date of Patent: Oct. 8, 2024

(54) SEMICONDUCTOR DEVICE WITH INTEGRATED DECOUPLING AND ALIGNMENT FEATURES

(71) Applicant: NANYA TECHNOLOGY CORPORATION, New Taipei (TW)

(72) Inventor: Tse-Yao Huang, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 371 days.

(21) Appl. No.: 17/556,149

(22) Filed: Dec. 20, 2021

(65) Prior Publication Data
US 2023/0197625 A1    Jun. 22, 2023

(51) Int. Cl.
| H01L 23/544 | (2006.01) |
| H01L 23/00 | (2006.01) |
| H01L 23/522 | (2006.01) |
| H01L 23/538 | (2006.01) |
| H01L 25/065 | (2023.01) |

(52) U.S. Cl.
CPC ........ *H01L 23/544* (2013.01); *H01L 23/5222* (2013.01); *H01L 23/5386* (2013.01); *H01L 24/32* (2013.01); *H01L 24/83* (2013.01); *H01L 25/0657* (2013.01); *H01L 2223/54426* (2013.01); *H01L 2224/32057* (2013.01); *H01L 2224/32145* (2013.01); *H01L 2224/8313* (2013.01); *H01L 2225/06593* (2013.01)

(58) Field of Classification Search
CPC ............... H01L 23/544; H01L 23/5222; H01L 23/5386; H01L 24/32; H01L 24/83; H01L 25/0657; H10B 80/00
USPC .......................................................... 257/797
See application file for complete search history.

(56) References Cited

U.S. PATENT DOCUMENTS

| 11,756,893 B2 * | 9/2023 | Huang .................. H01L 23/544 257/734 |
| 2013/0157389 A1 | 6/2013 | Wang et al. |

(Continued)

FOREIGN PATENT DOCUMENTS

| TW | 201320259 A | 5/2013 |
| TW | 201936486 A | 9/2019 |

(Continued)

*Primary Examiner* — Jasmine J Clark
(74) *Attorney, Agent, or Firm* — Muncy, Geissler, Olds & Lowe, P.C.

(57) ABSTRACT

The present application discloses a semiconductor device with integrated decoupling alignment features. The semiconductor device includes a first wafer comprising a first substrate having a dielectric stack, a decoupling feature positioned in the dielectric stack under one of the plurality of first alignment marks, a plurality of first alignment marks positioned on the first substrate and parallel to each other; and a second wafer positioned on the first wafer and comprising a plurality of second alignment marks positioned above the plurality of first alignment marks. The plurality of second alignment marks are arranged parallel to the plurality of first alignment marks and adjacent to the plurality of first alignment marks in a top-view perspective. The plurality of first alignment marks and the plurality of second alignment marks comprise a fluorescence material. The decoupling feature has a bottle-shaped cross-sectional profile, and the decoupling feature comprises a porous low-k material.

18 Claims, 26 Drawing Sheets

(56) References Cited

U.S. PATENT DOCUMENTS

2014/0131814 A1    5/2014  Shen et al.
2018/0331003 A1   11/2018  Bharath et al.
2019/0355636 A1   11/2019  Bharath et al.

FOREIGN PATENT DOCUMENTS

TW    202020998 A     6/2020
TW    202114194 A     4/2021
TW    202131297 A     8/2021
TW    202145494 A    12/2021

* cited by examiner

SEMICONDUCTOR DEVICE WITH INTEGRATED DECOUPLING AND ALIGNMENT FEATURES

TECHNICAL FIELD

The present disclosure relates to a semiconductor device, and more particularly, to a semiconductor device with integrated decoupling alignment features.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a first wafer comprising a first substrate and a plurality of first alignment marks positioned on the first substrate and parallel to each other; and a second wafer positioned on the first wafer and comprising a plurality of second alignment marks positioned above the plurality of first alignment marks. The plurality of second alignment marks are arranged parallel to the plurality of first alignment marks and adjacent to the plurality of first alignment marks in a top-view perspective. The plurality of first alignment marks and the plurality of second alignment marks comprise a fluorescence material. The plurality of first alignment marks and the plurality of second alignment marks together configure a first set of alignment marks.

Another aspect of the present disclosure provides a semiconductor device including a substrate; a dielectric stack positioned on the substrate; two conductive features positioned in the dielectric stack; a decoupling feature positioned in the dielectric stack, between the two second conductive features, and comprising a bottle-shaped cross-sectional profile; and an alignment mark positioned on the decoupling feature. The alignment mark comprises a fluorescence material.

Another aspect of the present disclosure provides a method for fabricating a semiconductor device including providing a first substrate; forming a plurality of first alignment marks on the first substrate and parallel to each other, wherein the first substrate and the plurality of first alignment marks together configure a first wafer; providing a second wafer comprising a plurality of second alignment marks parallel to each other; and bonding the second wafer onto the first wafer. The plurality of second alignment marks are arranged parallel to the plurality of first alignment marks and adjacent to the plurality of first alignment marks in a top-view perspective. The plurality of first alignment marks and the plurality of second alignment marks comprise a fluorescence material.

Another aspect of the present disclosure provides a method for fabricating a semiconductor device including providing a substrate; forming a first dielectric layer on the substrate; forming a second dielectric layer on the first dielectric layer; forming two second conductive features on the second dielectric layer; forming a middle dielectric layer on the second dielectric layer and surrounding the two second conductive features; performing an expansion etch process to form an expanded opening in the middle dielectric layer; forming a decoupling feature in the expanded opening; and forming an alignment mark on the decoupling feature. The alignment mark comprises a fluorescence material.

Due to the design of the semiconductor device of the present disclosure, the plurality of alignment marks including fluorescence material may improve optical recognition during wafer bonding process. In addition, the complementary design makes the plurality of first alignment marks and the plurality of second alignment marks become references for each other during the bonding process. As a result, the yield and reliability of the semiconductor device may be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
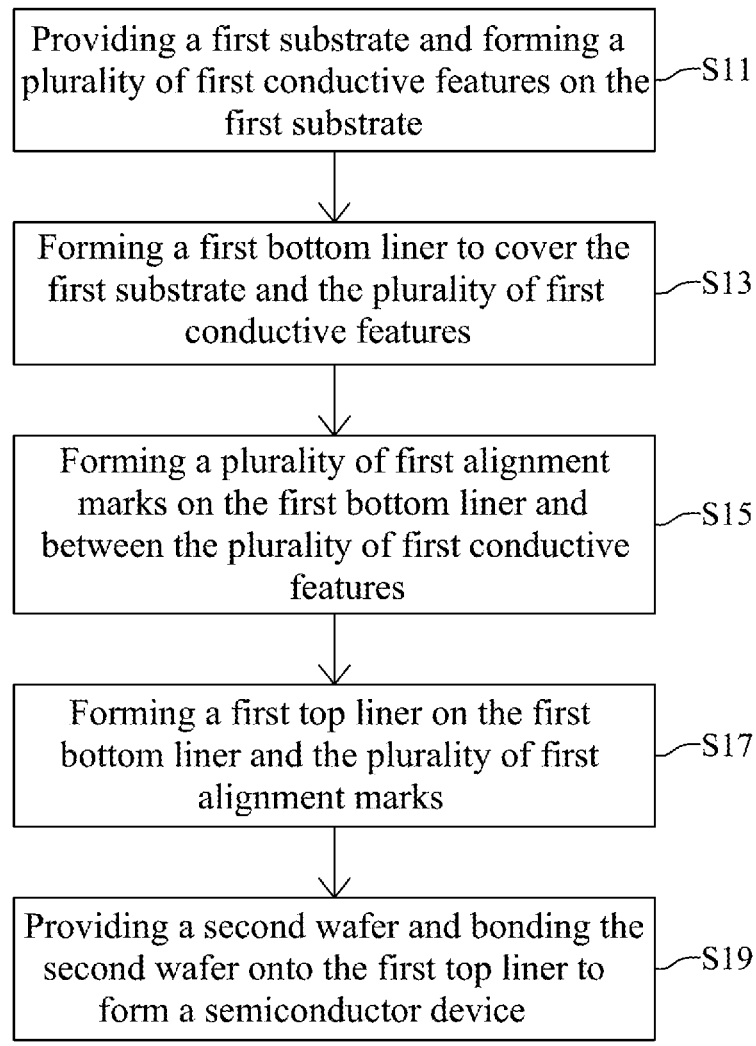
FIG. 1 illustrates, in a flowchart diagram form, a method for fabricating a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

It should be noted that, in the description of the present disclosure, the terms "forming," "formed" and "form" may mean and include any method of creating, building, patterning, implanting, or depositing an element, a dopant or a material. Examples of forming methods may include, but are not limited to, atomic layer deposition, chemical vapor deposition, physical vapor deposition, sputtering, co-sputtering, spin coating, diffusing, depositing, growing, implantation, photolithography, dry etching, and wet etching.

It should be noted that, in the description of the present disclosure, the functions or steps noted herein may occur in an order different from the order noted in the figures. For example, two figures shown in succession may in fact be executed substantially concurrently or may sometimes be executed in a reversed order, depending upon the functionalities or steps involved.

Figure 6:
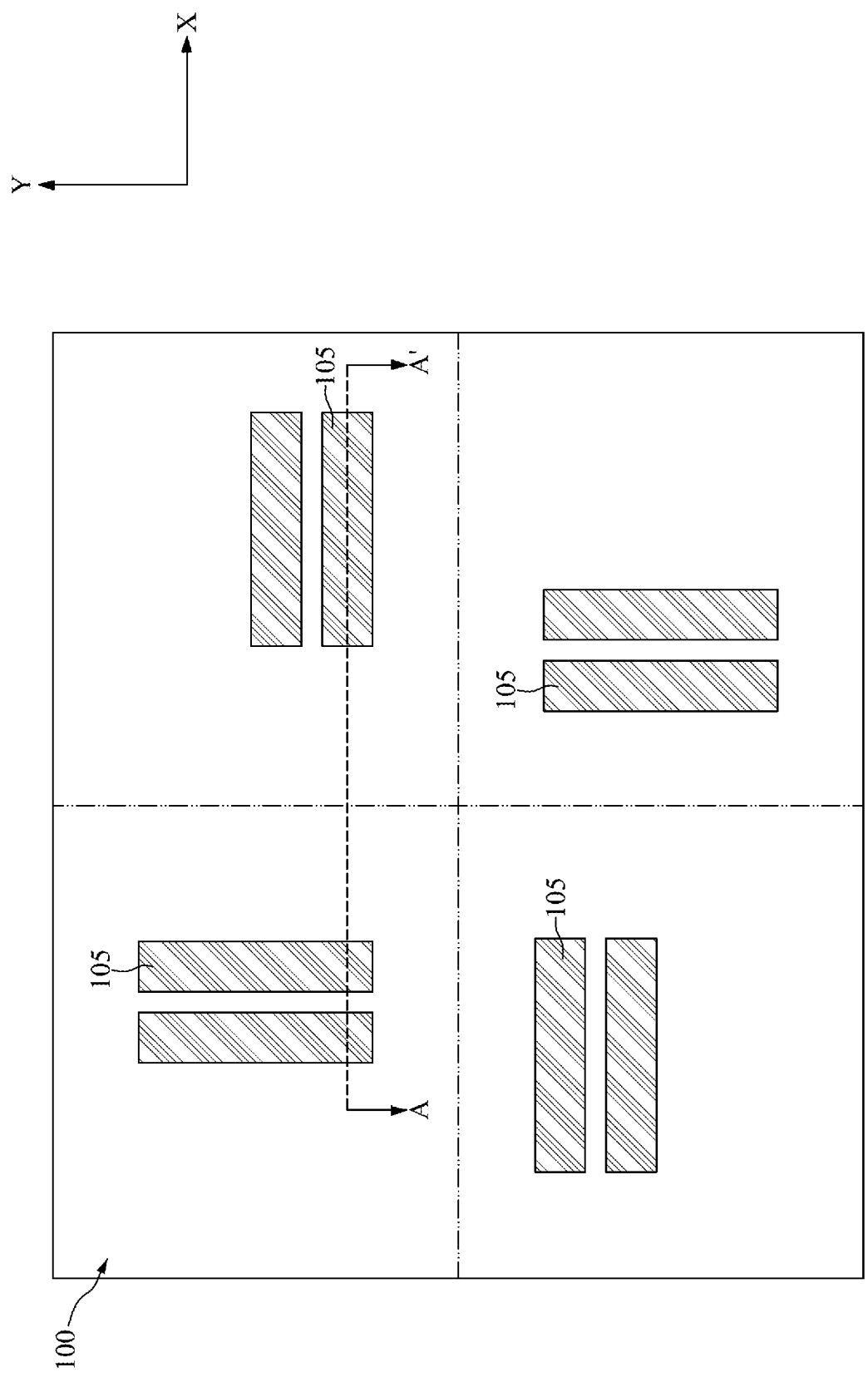
FIG. 6 illustrates, in a schematic top-view diagram, an intermediate semiconductor device in accordance with one embodiment of the present disclosure.
Figure 7:
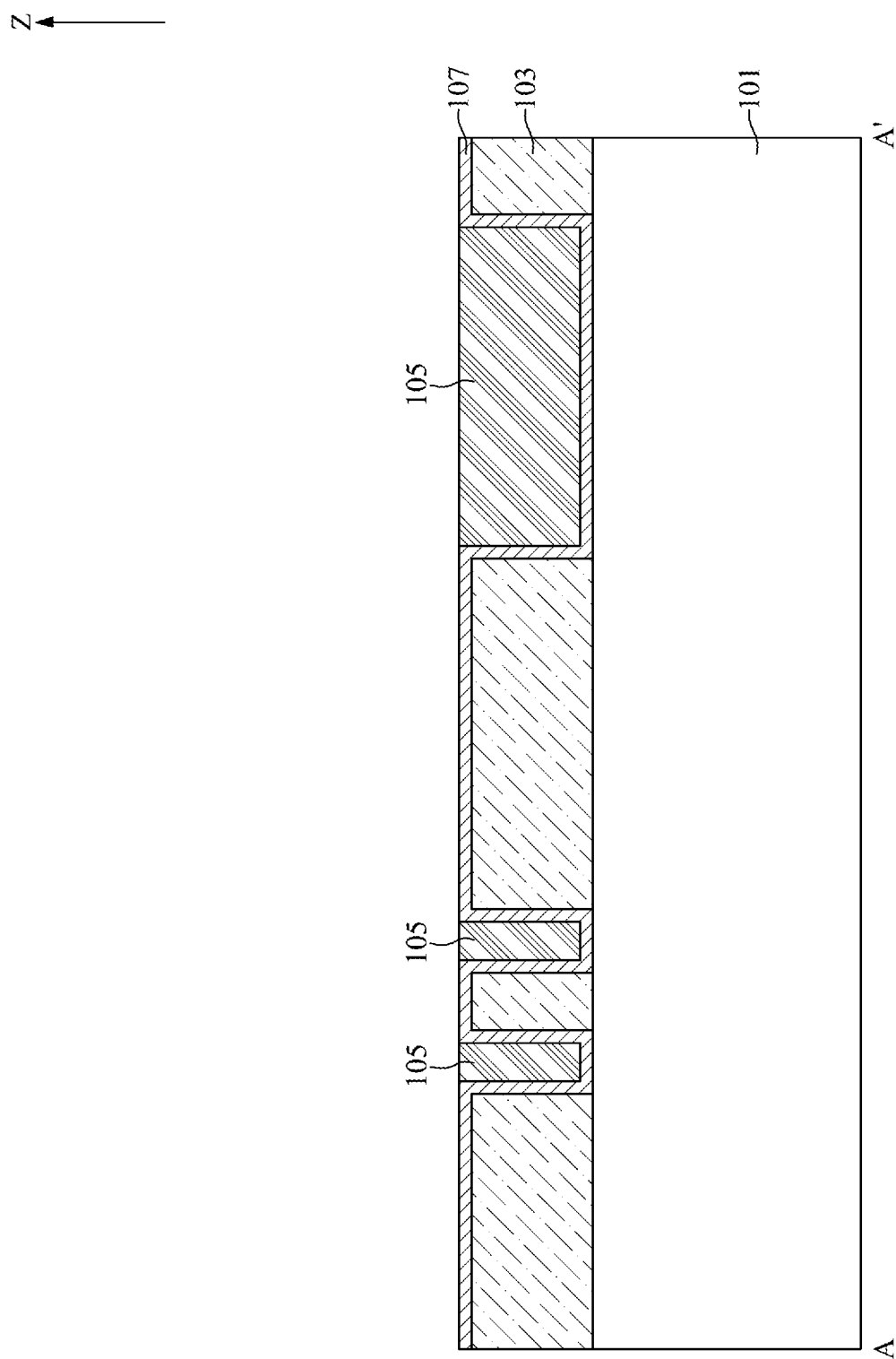
FIGS. 7 and 8 are schematic cross-sectional view diagrams taken along a line A-A' in FIG. 6 illustrating part of the flow for fabricating the semiconductor device in accordance with one embodiment of the present disclosure.
Figure 8:
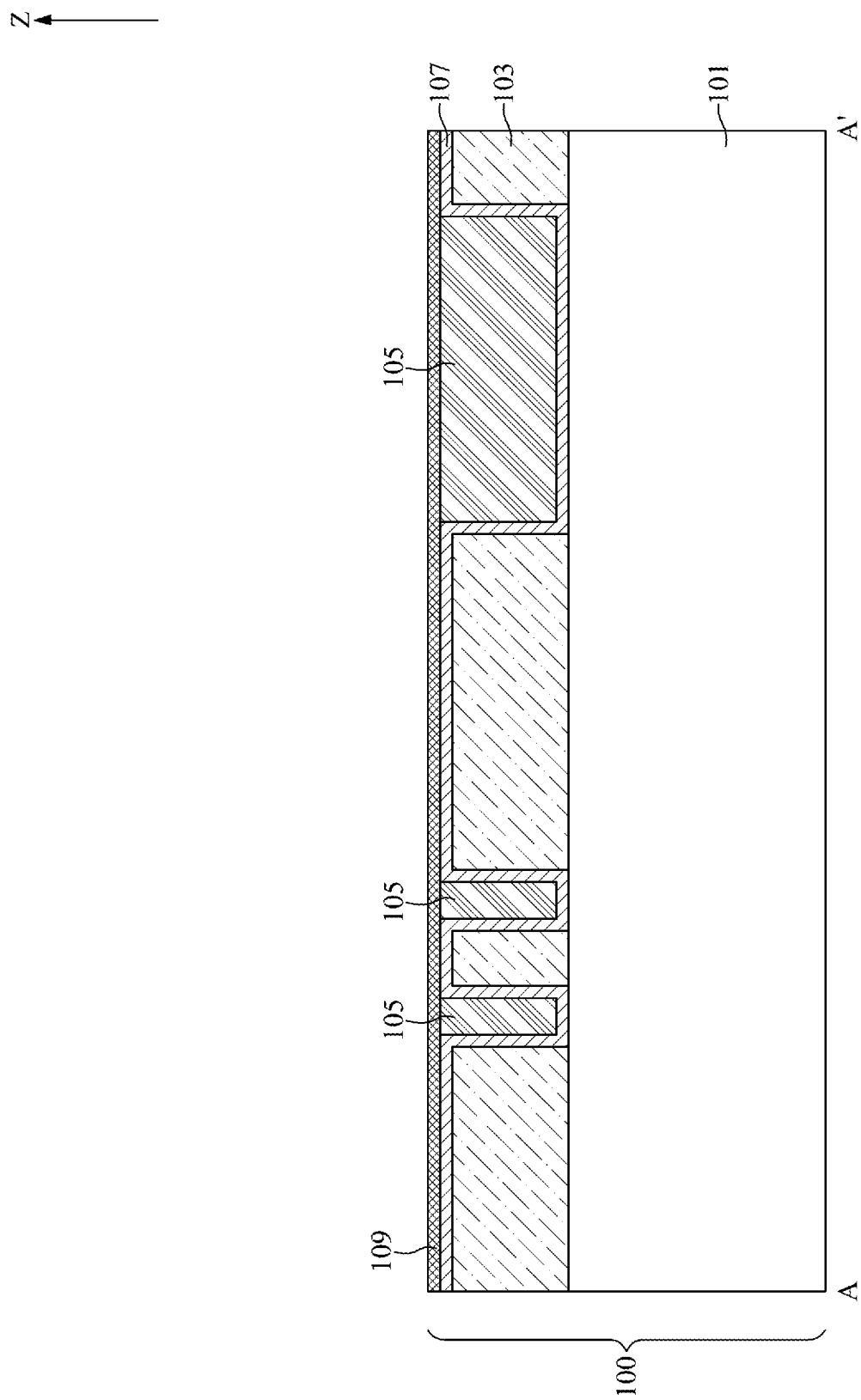

FIG. 1 illustrates, in a flowchart diagram form, a method 10 for fabricating a semiconductor device 1A in accordance with one embodiment of the present disclosure. FIGS. 2 to 5 illustrate, in schematic cross-sectional view diagrams, part of a flow for fabricating the semiconductor device 1A in accordance with one embodiment of the present disclosure. FIG. 6 illustrates, in a schematic top-view diagram, an intermediate semiconductor device in accordance with one embodiment of the present disclosure. FIGS. 7 and 8 are schematic cross-sectional view diagrams taken along a line A-A' in FIG. 6 illustrating part of the flow for fabricating the semiconductor device 1A in accordance with one embodiment of the present disclosure. It should be noted that some elements of the semiconductor device 1A are omitted in the top-view diagrams for clarity.

Figure 2:
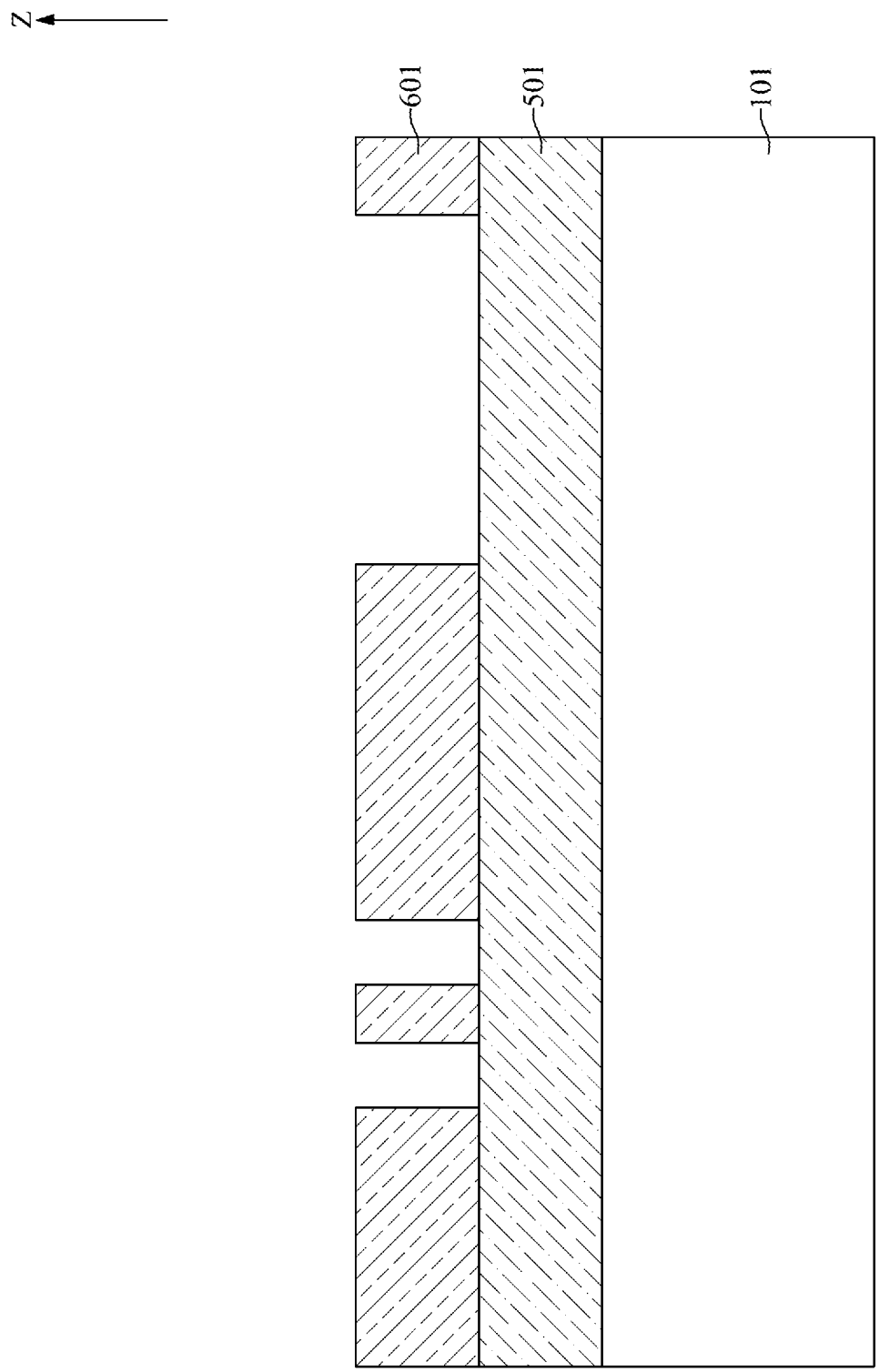
FIGS. 2 to 5 illustrate, in schematic cross-sectional view diagrams, part of a flow for fabricating the semiconductor device in accordance with one embodiment of the present disclosure.
Figure 3:
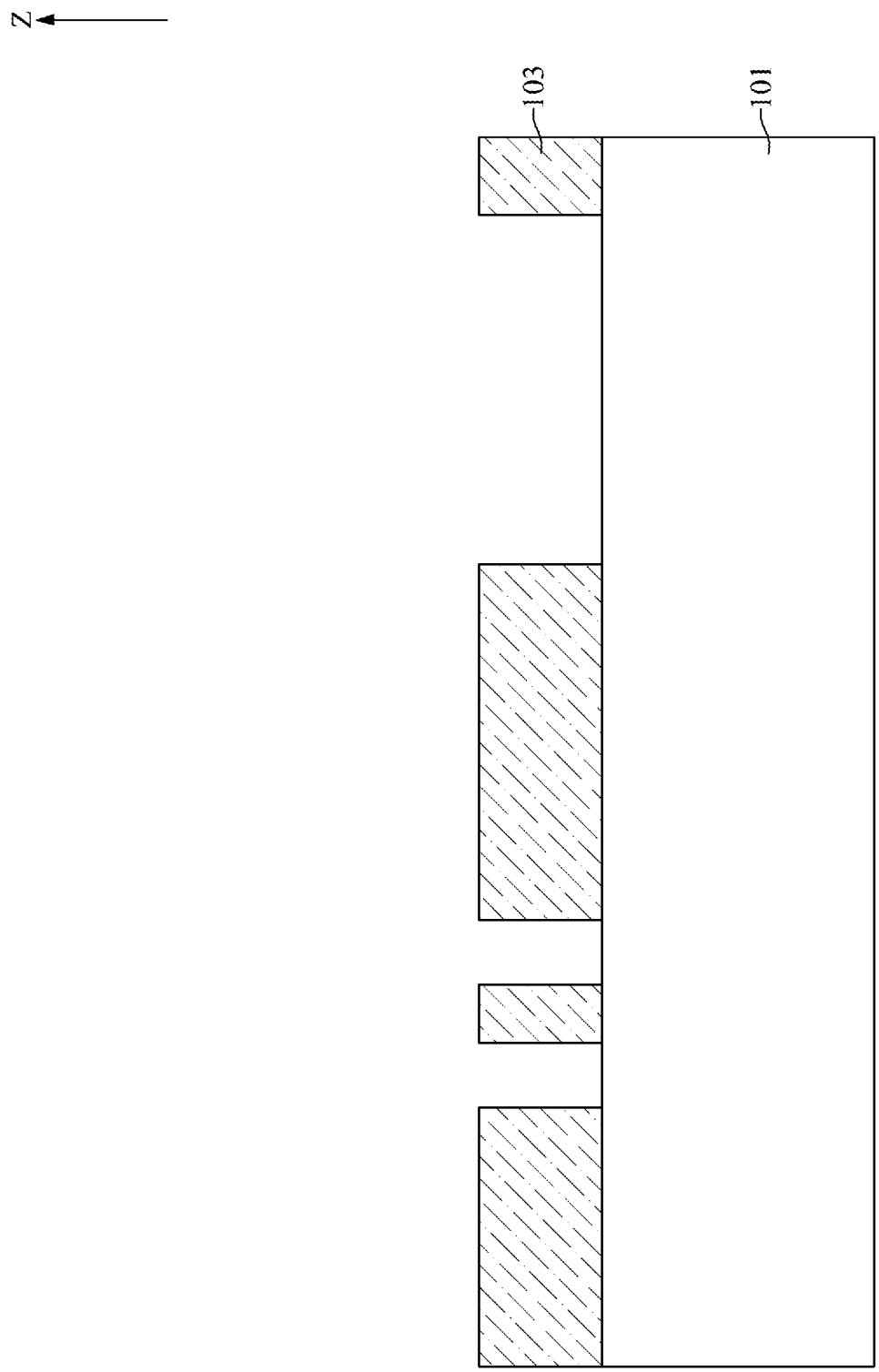

With reference to FIGS. 1 to 3, at step S11, a first substrate 101 may be provided and a plurality of first conductive features 103 may be formed on the first substrate 101.

With reference to FIG. 2, the first substrate 101 may include a bulk semiconductor substrate that is composed entirely of at least one semiconductor material, a plurality of device elements (not show for clarity), a plurality of dielectric layers (not shown for clarity), and a plurality of conductive features (not show for clarity). The bulk semiconductor substrate may be formed of, for example, an elementary semiconductor, such as silicon or germanium; a compound semiconductor, such as silicon germanium, silicon carbide, gallium arsenide, gallium phosphide, indium phosphide, indium arsenide, indium antimonide, or other III-V compound semiconductor or II-VI compound semiconductor; or combinations thereof.

In some embodiments, the first substrate 101 may include a semiconductor-on-insulator structure which consisting of, from bottom to top, a handle substrate, an insulator layer, and a topmost semiconductor material layer. The handle substrate and the topmost semiconductor material layer may be formed of the same material as the bulk semiconductor substrate aforementioned. The insulator layer may be a crystalline or non-crystalline dielectric material such as an oxide and/or nitride. For example, the insulator layer may be a dielectric oxide such as silicon oxide. For another example, the insulator layer may be a dielectric nitride such as silicon nitride or boron nitride. For yet another example, the insulator layer may include a stack of a dielectric oxide and a dielectric nitride such as a stack of, in any order, silicon oxide and silicon nitride or boron nitride. The insulator layer may have a thickness between about 10 nm and 200 nm.

It should be noted that, in the description of present disclosure, the term "about" modifying the quantity of an ingredient, component, or reactant of the present disclosure employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

With reference to FIG. 2, the plurality of device elements may be formed on the bulk semiconductor substrate or the topmost semiconductor material layer. Some portions of the plurality of device elements may be formed in the bulk semiconductor substrate or the topmost semiconductor material layer. The plurality of device elements may be transistors such as complementary metal-oxide-semiconductor transistors, metal-oxide-semiconductor field-effect transistors, fin field-effect-transistors, the like, or a combination thereof.

With reference to FIG. 2, the plurality of dielectric layers may be formed on the bulk semiconductor substrate or the topmost semiconductor material layer and cover the plurality of device elements. In some embodiments, the plurality of dielectric layers may be formed of, for example, silicon oxide, borophosphosilicate glass, undoped silicate glass, fluorinated silicate glass, low-k dielectric materials, the like, or a combination thereof. The low-k dielectric materials may have a dielectric constant less than 3.0 or even less than 2.5. In some embodiments, the low-k dielectric materials may have a dielectric constant less than 2.0. The plurality of dielectric layers may be formed by deposition processes such as chemical vapor deposition, plasma-enhanced chemical vapor deposition, or the like. Planarization processes may be performed after the deposition processes to remove excess material and provide a substantially flat surface for subsequent processing steps.

With reference to FIG. 2, the plurality of conductive features may include interconnect layers and conductive vias. The interconnect layers may be separated from each other and may be horizontally disposed in the plurality of dielectric layers along the direction Z. The conductive vias may connect adjacent interconnect layers along the direction Z, and adjacent device element and interconnect layer. In some embodiments, the conductive vias may improve heat dissipation and may provide structure support. In some embodiments, the plurality of conductive features may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. The plurality of conductive features may be formed during the formation of the plurality of dielectric layers.

In some embodiments, the plurality of device elements and the plurality of conductive features may together configure functional units in the first substrate 101. A functional unit, in the description of the present disclosure, generally refers to functionally related circuitry that has been partitioned for functional purposes into a distinct unit. In some embodiments, functional units may be typically highly complex circuits such as processor cores, memory controllers, or accelerator units. In some other embodiments, the complexity and functionality of a functional unit may be more or less complex.

With reference to FIG. 2, a layer of first material 501 may be formed on the first substrate 101. In some embodiments, the first material 501 may be, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. The layer of first material 501 may be formed by, for example, physical vapor deposition, sputtering, chemical vapor deposition, or other applicable deposition process.

With reference to FIG. 2, a first mask layer 601 may be formed on the layer of first material 501. The first mask layer 601 may be a photoresist layer and may include the pattern of the plurality of first conductive features 103.

With reference to FIG. 3, an etch process, such as an anisotropic dry etch process, may be performed to remove portions of the first material 501 and concurrently form the plurality of first conductive features 103 on the first substrate 101. The etch rate ratio of the first material 501 to the first substrate 101 may be between about 100:1 and about 1.05:1, between about 15:1 and about 2:1, or between about 10:1 and about 2:1 during the etch process. After the etch process, the first mask layer 601 may be removed. In some embodiments, the plurality of first conductive features 103 may be electrically coupled to the plurality of device elements but are not limited thereto. In some embodiments, the plurality of first conductive features 103 may be configured as testing circuits.

Figure 4:
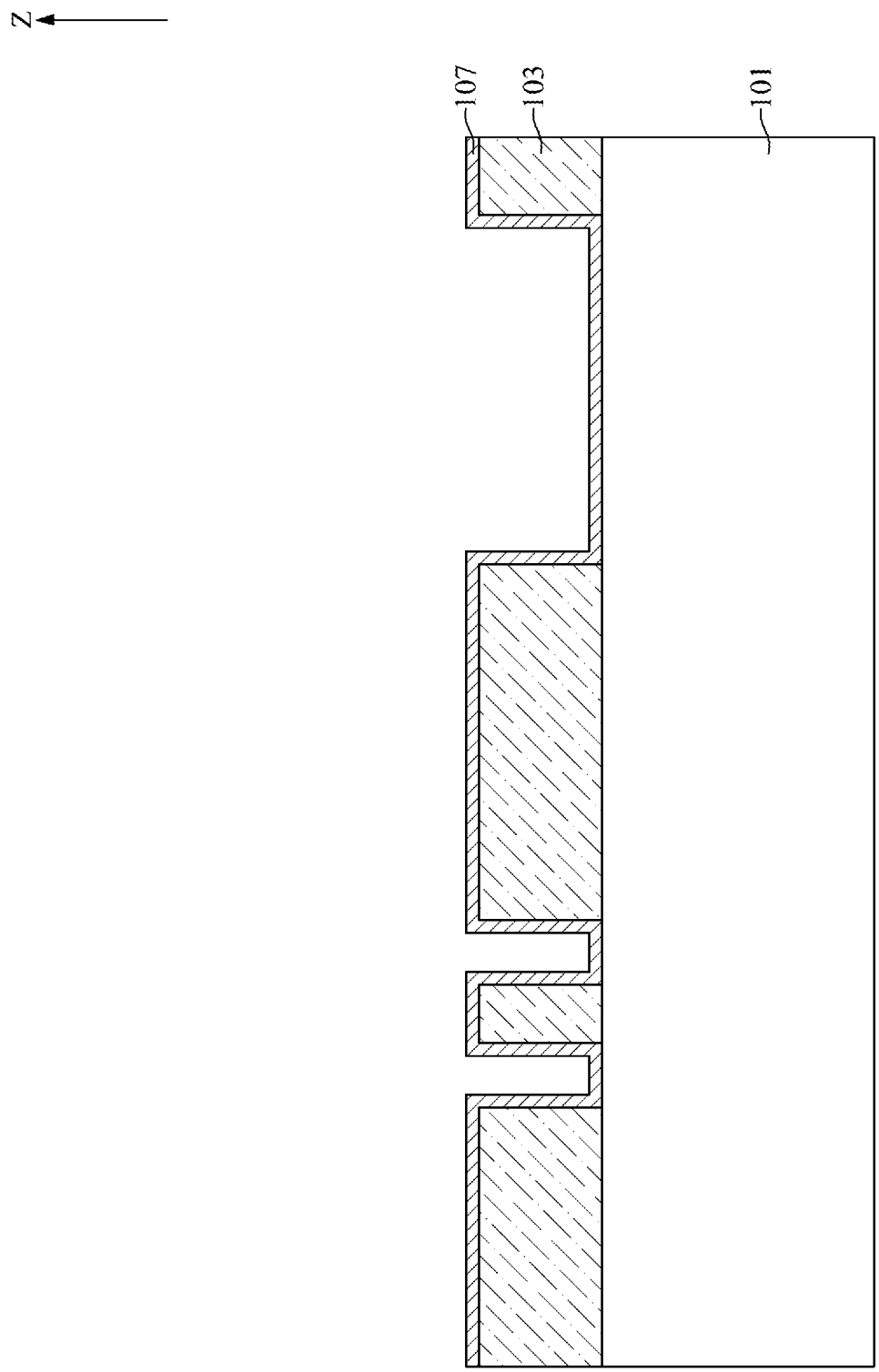

With reference to FIGS. 1 and 4, at step S13, a first bottom liner 107 may be formed to cover the first substrate 101 and the plurality of first conductive features 103.

With reference to FIG. 4, the first bottom liner 107 may be conformally formed to cover the first substrate 101 and the plurality of first conductive features 103. In some embodiments, the first bottom liner 107 may be formed by, for example, atomic layer deposition. Generally, an atomic layer deposition alternately supplies two (or more) different source gases one by one onto a process object (e.g., the first substrate 101 and the plurality of first conductive features 103) under predetermined process conditions, so that chemical species is adsorbed to the process object at a single atomic layer level, and are deposited on the process object through surface reactions. For instance, first and second source gases are alternately supplied to a process object to flow along the surface thereof, thereby molecules contained in the first source gas adsorb to the surface, and molecules contained in the second source gas react with the adsorbed molecules originated from the first source gas to form a film of a thickness of a single molecule level. The above process steps are performed repeatedly, so that a high-quality film can be formed on the process object.

In some embodiments, the first bottom liner 107 may be formed of, for example, silicon oxide, silicon nitride, silicon oxynitride, silicon nitride oxide, the like, or a combination thereof. It should be noted that, in the description of the present disclosure, silicon oxynitride refers to a substance which contains silicon, nitrogen, and oxygen and in which a proportion of oxygen is greater than that of nitrogen. Silicon nitride oxide refers to a substance which contains silicon, oxygen, and nitrogen and in which a proportion of nitrogen is greater than that of oxygen.

It should be noted that the first bottom liner 107 completely covering the plurality of first conductive features 103 and the first substrate 101 in FIG. 4 is just for illustration purpose, some portions of the plurality of first conductive features 103 may be exposed for electrically coupling to other elements.

With reference to FIG. 1 and FIGS. 5 to 7, at step S15, a plurality of first alignment marks 105 may be formed on the first bottom liner 107 and between the plurality of first conductive features 103.

Figure 5:
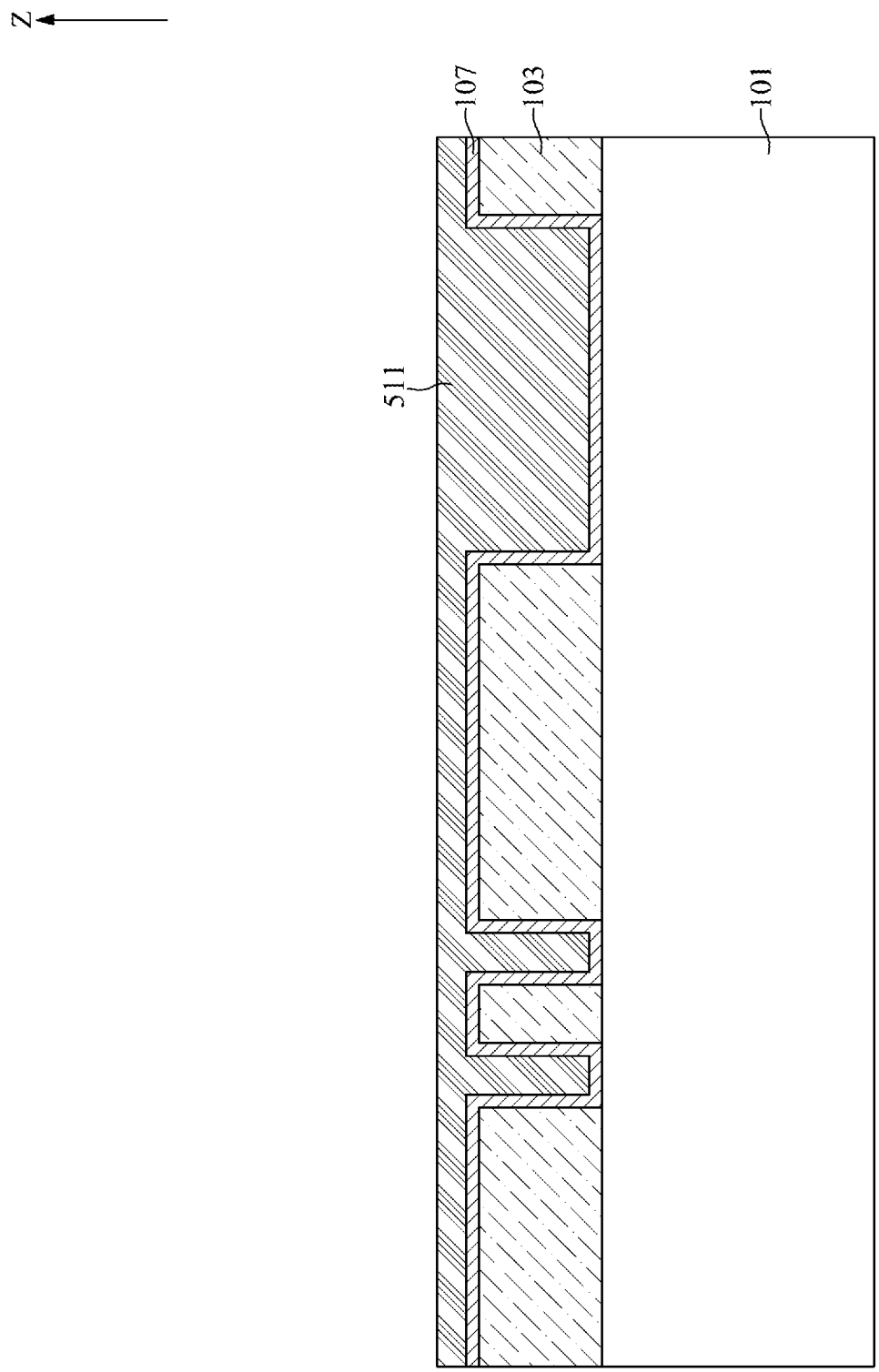

With reference to FIG. 5, an insulating layer 511 may be formed on the first bottom liner 107 and completely fill the spaces between adjacent first conductive features 103. The insulating layer 511 may include a fluorescence material. In some embodiments, the fluorescence material may be azobenzene. In some embodiments, the insulating layer 511 may be formed by, for example, chemical vapor deposition.

With reference to FIGS. 6 and 7, a planarization process, such as chemical mechanical polishing, may be performed until the first bottom liner 107 is exposed to remove excess material, provide a substantially flat surface for subsequent processing steps, and concurrently turn the insulating layer 511 into the plurality of first alignment marks 105. In a cross-sectional perspective, the plurality of first conductive features 103 may horizontally surround the plurality of first alignment marks 105, and the plurality of first alignment marks 105 may be parallel to each other. In a top-view perspective, the plurality of first alignment marks 105 located at the upper left area may extend along the direction Y and parallel to each other. The plurality of first alignment marks 105 located at the upper right area may extend along the direction X and parallel to each other. The plurality of first alignment marks 105 located at the lower left area may extend along the direction X and parallel to each other. The plurality of first alignment marks 105 located at the lower right area may extend along the direction Y and parallel to each other.

The plurality of first alignment marks 105 including fluorescence material may improve optical recognition during following wafer bonding process.

With reference to FIGS. 1 and 8, at step S17, a first top liner 109 may be formed on the first bottom liner 107 and the plurality of first alignment marks 105.

With reference to FIG. 8, the first top liner 109 may be conformally formed on the first bottom liner 107 and the plurality of first alignment marks 105. In some embodiments, the first top liner 109 may be formed of, for example, silicon oxide, silicon nitride, silicon oxynitride, silicon nitride oxide, the like, or a combination thereof. In some embodiments, the first top liner 109 may be formed by, for example, atomic layer deposition. The first top liner 109 may serve as a protection layer to prevent the fluorescence material in the plurality of first alignment marks 105 being damaged during subsequent semiconductor processes. In addition, the first top liner 109 may also serve as a barrier layer to prevent the fluorescence material in the plurality of first alignment marks 105 diffusing out to contaminate adjacent elements.

The first substrate 101, the plurality of first conductive features 103, the plurality of first alignment marks 105, the first bottom liner 107, and the first top liner 109 together configure a first wafer 100. The first wafer 100 may be configured as logic chips or memory chips.

Figure 9:
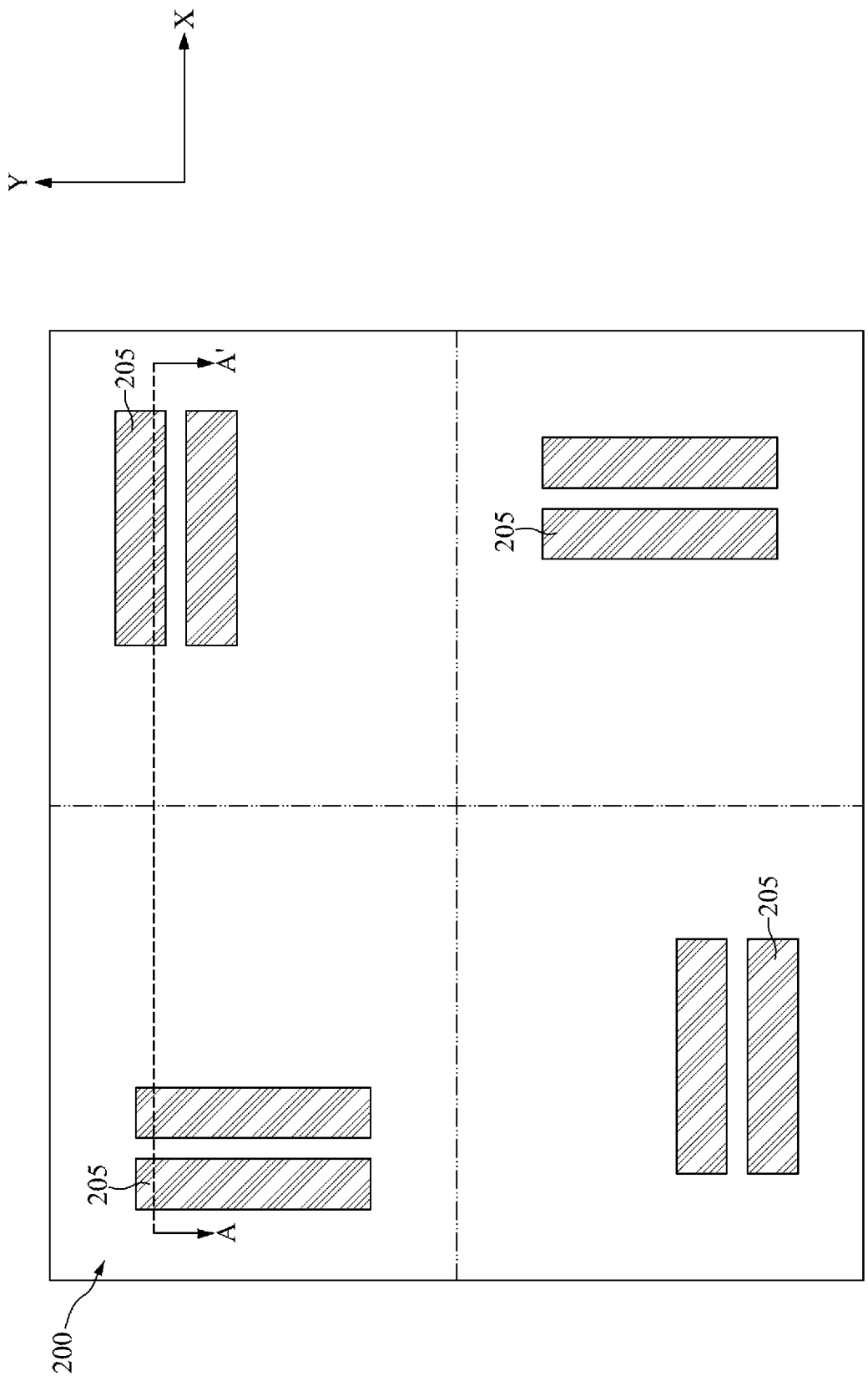
FIG. 9 illustrates, in a schematic top-view diagram, an intermediate semiconductor device in accordance with one embodiment of the present disclosure.
Figure 10:
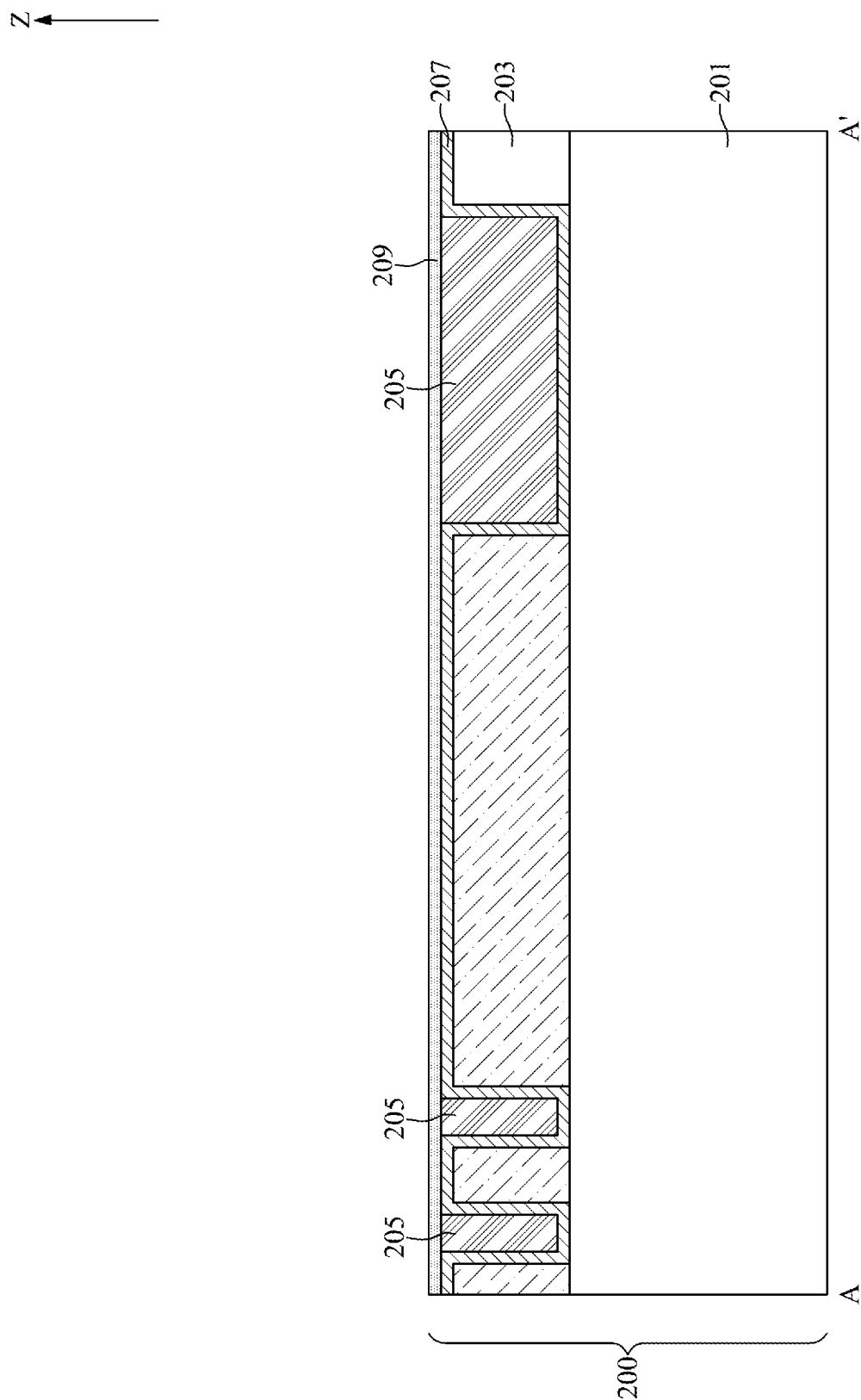
FIG. 10 is a schematic cross-sectional view diagram taken along a line A-A' in FIG. 9 illustrating part of the flow for fabricating the semiconductor device in accordance with one embodiment of the present disclosure.
Figure 11:
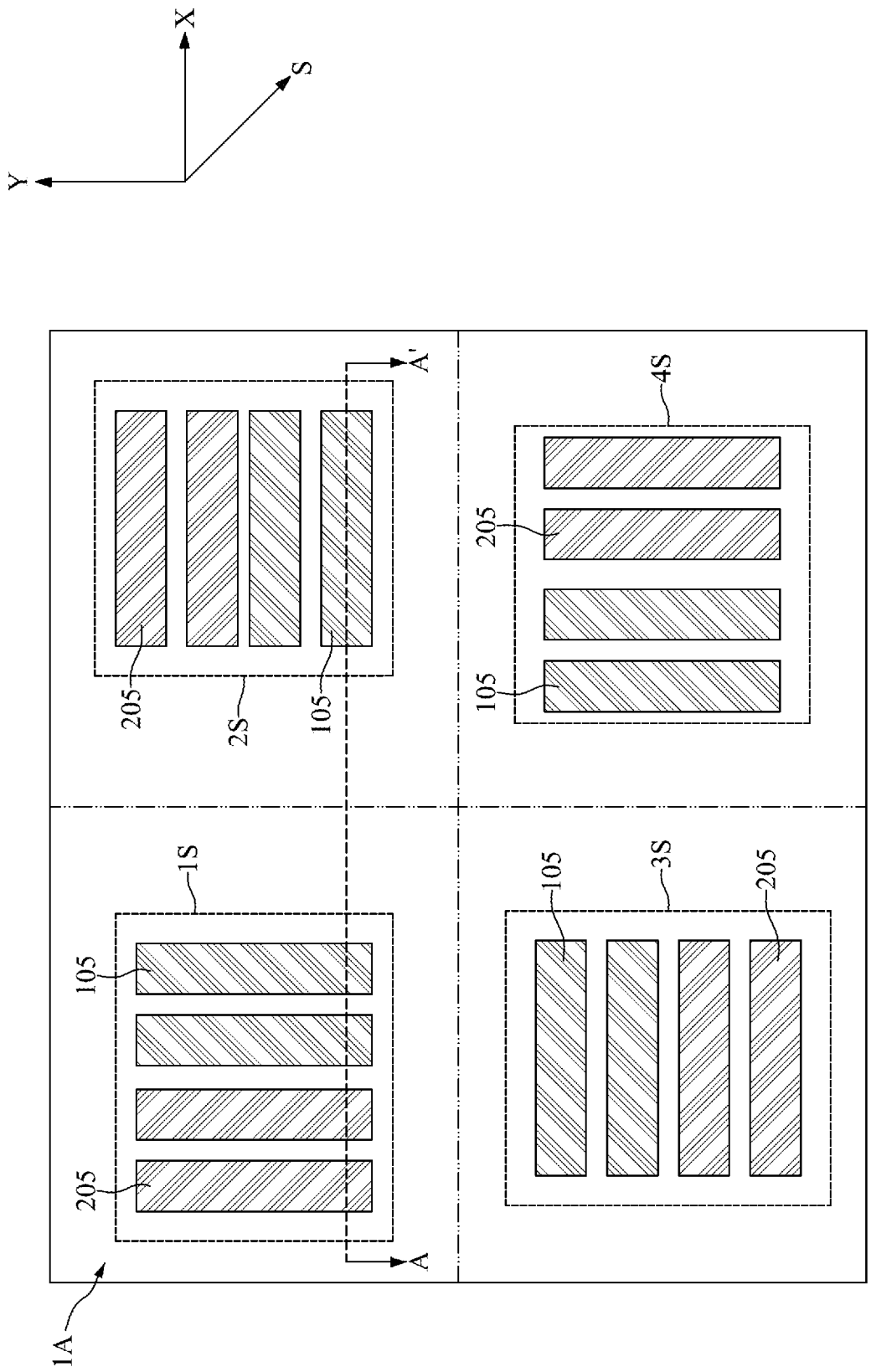
FIG. 11 illustrates, in a schematic top-view diagram, an intermediate semiconductor device in accordance with one embodiment of the present disclosure.
Figure 12:
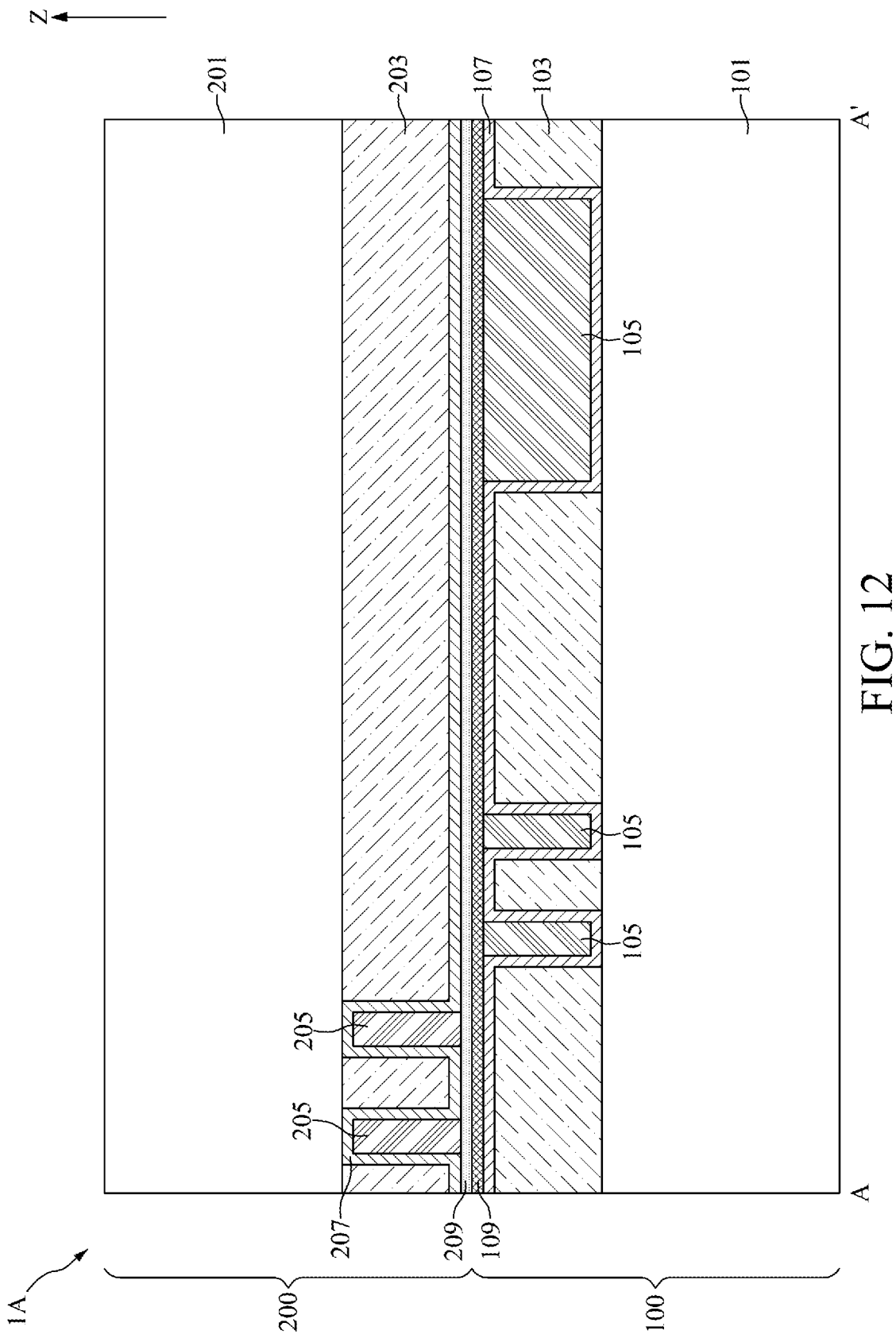
FIG. 12 is a schematic cross-sectional view diagram taken along a line A-A' in FIG. 11 illustrating part of the flow for fabricating the semiconductor device in accordance with one embodiment of the present disclosure.

FIG. 9 illustrates, in a schematic top-view diagram, an intermediate semiconductor device in accordance with one embodiment of the present disclosure. FIG. 10 is a schematic cross-sectional view diagram taken along a line A-A' in FIG. 9 illustrating part of the flow for fabricating the semiconductor device 1A in accordance with one embodiment of the present disclosure. FIG. 11 illustrates, in a schematic top-view diagram, an intermediate semiconductor device in accordance with one embodiment of the present disclosure. FIG. 12 is a schematic cross-sectional view diagram taken along a line A-A' in FIG. 11 illustrating part of the flow for fabricating the semiconductor device 1A in accordance with one embodiment of the present disclosure.

With reference to FIG. 1 and FIGS. 9 to 12, at step S19, a second wafer 200 may be provided and the second wafer 200 may be bonded onto the first top liner 109 to form the semiconductor device 1A.

With reference to FIGS. 9 and 10, the second wafer 200 may include a second substrate 201, a plurality of second conductive features 203, a plurality of second alignment marks 205, a second bottom liner 207, and a second top liner 209. The second substrate 201, the plurality of second conductive features 203, the plurality of second alignment marks 205, the second bottom liner 207, and the second top liner 209 may be formed of procedures similar to the first substrate 101, the plurality of first conductive features 103, the plurality of first alignment marks 105, the first bottom liner 107, and the first top liner 109 as illustrating in FIGS. 2 to 8, respectively and correspondingly, and descriptions thereof are not repeated herein.

In some embodiments, the plurality of second alignment marks 205 may include a fluorescence material. The fluorescence material may be, for example, azobenzene. The plurality of second alignment marks 205 including fluorescence material may improve optical recognition during following wafer bonding process.

In some embodiments, in a cross-sectional perspective, the plurality of second conductive features 203 may horizontally surround the plurality of second alignment marks 205, and the plurality of second alignment marks 205 may be parallel to each other. In a top-view perspective, the plurality of second alignment marks 205 located at the upper left area may extend along the direction Y and parallel to each other. The plurality of second alignment marks 205 located at the upper right area may extend along the direction X and parallel to each other. The plurality of second alignment marks 205 located at the lower left area may extend along the direction X and parallel to each other. The plurality of second alignment marks 205 located at the lower right area may extend along the direction Y and parallel to each other.

In some embodiments, the second wafer 200 may be configured as memory chips.

With reference to FIGS. 11 and 12, the second wafer 200 may be flipped and bonded onto the first wafer 100. In some embodiments, the bonding of the second wafer 200 and the first wafer 100 may be, for example, oxide bonding through the first top liner 109 formed of oxide and the second top liner 209 formed of oxide.

In a top-view perspective, the plurality of first alignment marks 105 and the plurality of second alignment marks 205 may be arranged complementary to each other. That is, the plurality of first alignment marks 105 and the plurality of second alignment marks 205 may not overlapped with each other. The complementary design makes the plurality of first alignment marks 105 and the plurality of second alignment marks 205 become references for each other during the bonding process. As a result, the yield and reliability of the semiconductor device 1A may be improved.

In some embodiments, the plurality of first alignment marks 105 and the plurality of second alignment marks 205 located at upper left area may be referred to as a first set of alignment marks 1S. The alignment marks (i.e., the first alignment marks 105 and the second alignment marks 205) of the first set of alignment marks 1S may extend along the direction X and are parallel to each other.

In some embodiments, the plurality of first alignment marks 105 and the plurality of second alignment marks 205 located at upper right area may be referred to as a second set of alignment marks 2S. The second set of alignment marks 2S may be distant from the first set of alignment marks 1S along the direction X. The alignment marks of the second set of alignment marks 2S may extend along the direction X and are parallel to each other.

In some embodiments, the plurality of first alignment marks 105 and the plurality of second alignment marks 205 located at lower left area may be referred to as a third set of alignment marks 3S. The third set of alignment marks 3S may be distant from the first set of alignment marks 1S along the direction Y. The alignment marks of the third set of alignment marks 3S may extend along the direction X and are parallel to each other.

In some embodiments, the plurality of first alignment marks 105 and the plurality of second alignment marks 205 located at lower right area may be referred to as a fourth set of alignment marks 4S. The fourth set of alignment marks 4S may be distant from the first set of alignment marks 1S along a direction S. The direction S may be slanted with respective with the direction X and the direction Y. The alignment marks of the fourth set of alignment marks 4S may extend along the direction Y and are parallel to each other.

Figure 13:
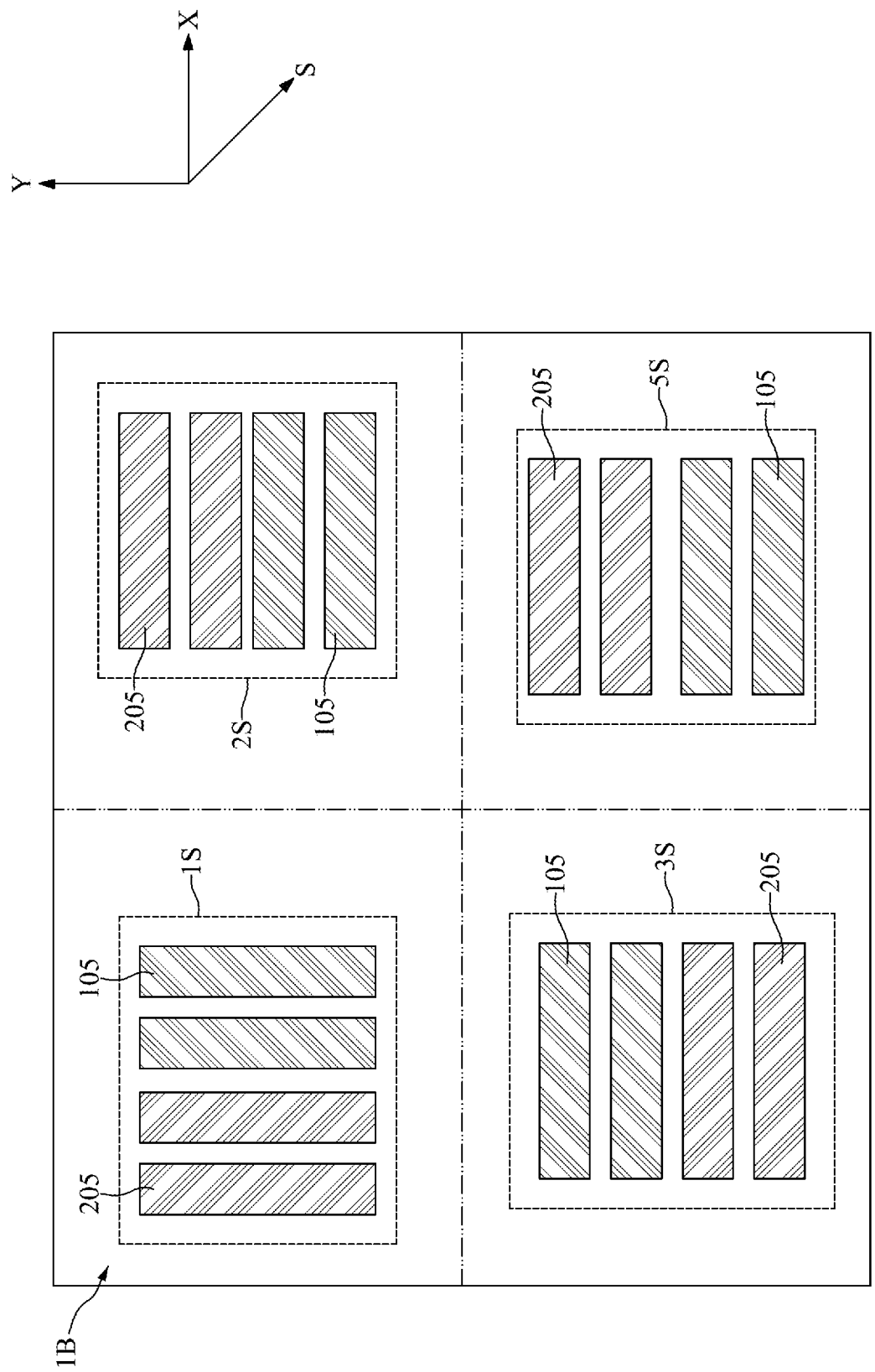
FIG. 13 illustrates, in a schematic top-view diagram, a semiconductor device in accordance with another embodiment of the present disclosure.

FIG. 13 illustrates, in a schematic top-view diagram, a semiconductor device 1B in accordance with another embodiment of the present disclosure.

With reference to FIG. 13, the semiconductor device 1B may have a structure similar to that illustrated in FIG. 11. The same or similar elements in FIG. 13 as in FIG. 11 have been marked with similar reference numbers and duplicative descriptions have been omitted. The semiconductor device 1B may include a fifth set of alignment marks 5S. The fifth set of alignment marks 5S may be distant from the first set of alignment marks 1S along the direction S. The alignment marks (i.e., the first alignment marks 105 and the second alignment marks 205) of the fifth set of alignment marks 5S may extend along the direction X and are parallel to each other.

Figure 14:
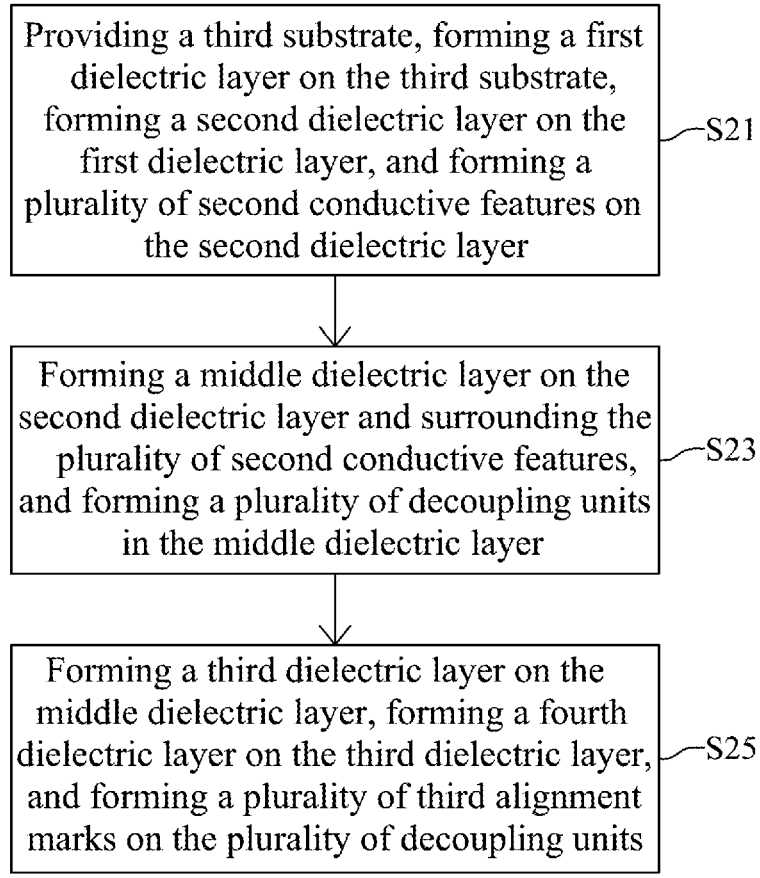
FIG. 14 illustrates, in a flowchart diagram form, a method for fabricating a semiconductor device in accordance with another embodiment of the present disclosure.

FIG. 14 illustrates, in a flowchart diagram form, a method 20 for fabricating a semiconductor device 1C in accordance with another embodiment of the present disclosure. FIGS. 15 to 25 illustrate, in schematic cross-sectional view diagrams, part of a flow for fabricating the semiconductor device 1C in accordance with another embodiment of the present disclosure.

With reference to FIGS. 14 to 18, at step S21, a third substrate 301 may be provided, a first dielectric layer 303 may be formed on the third substrate 301, a second dielectric layer 305 may be formed on the first dielectric layer 303, and a plurality of second conductive features 313 may be formed on the second dielectric layer 305.

Figure 15:
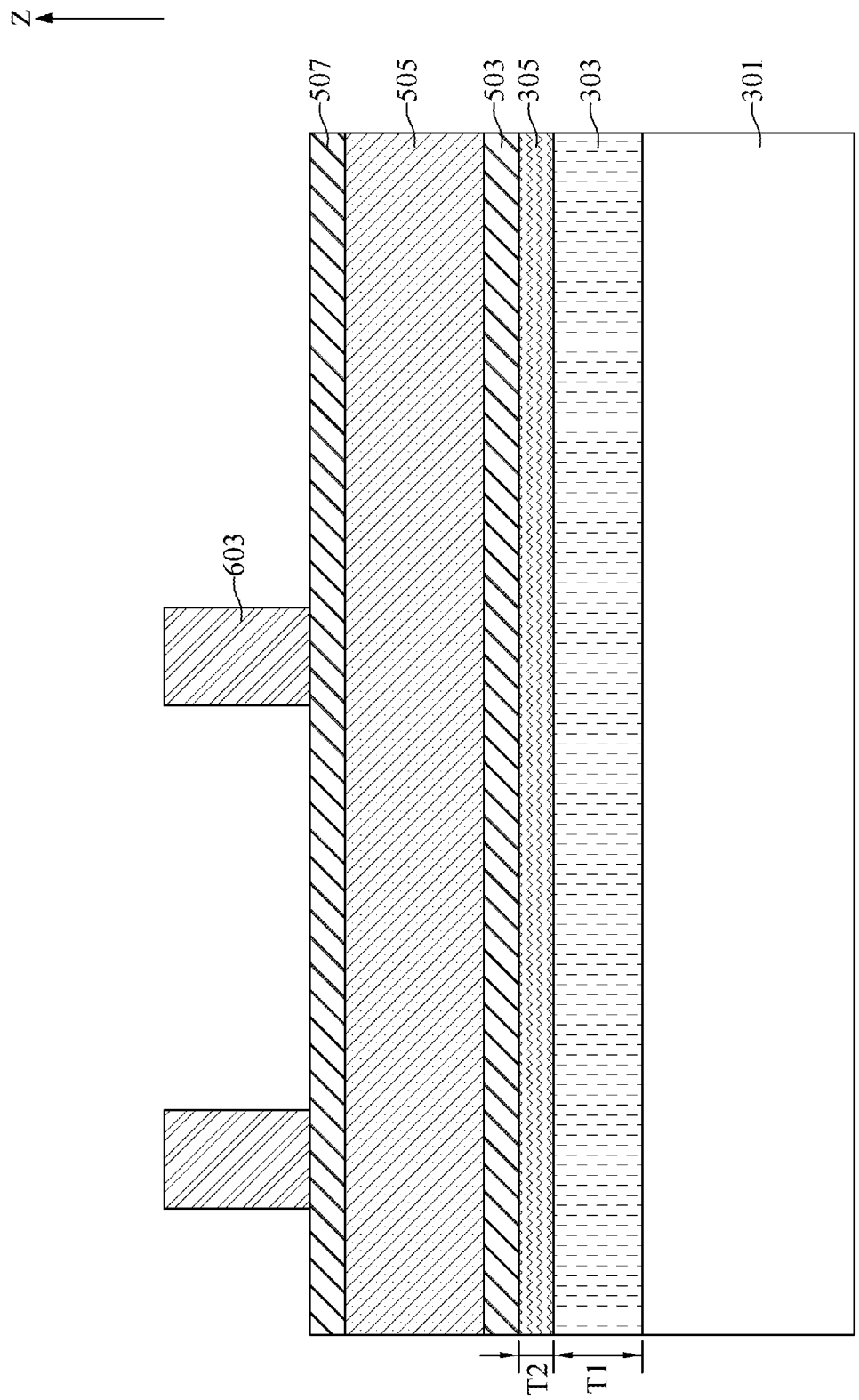
FIGS. 15 to 25 illustrate, in schematic cross-sectional view diagrams, part of a flow for fabricating the semiconductor device in accordance with another embodiment of the present disclosure.

With reference to FIG. 15, the third substrate 301 may be formed of a procedure similar to the first substrate 101 as illustrating in FIG. 2, and descriptions thereof are not repeated herein.

With reference to FIG. 15, in some embodiments, the first dielectric layer 303 may be formed of, for example, fluorosilicate glass, borophosphosilicate glass, a spin-on low-k dielectric layer, a chemical vapor deposition low-k dielectric layer, or a combination thereof. In some embodiments, the first dielectric layer 303 may include a self-planarizing material such as a spin-on glass or a spin-on low-k dielectric material such as SiLK™. The use of a self-planarizing dielectric material may avoid the need to perform a subsequent planarizing step. In some embodiments, the first dielectric layer 303 may be formed by a deposition process including, for example, chemical vapor deposition, plasma enhanced chemical vapor deposition, evaporation, or spin-on coating.

With reference to FIG. 15, in some embodiments, the second dielectric layer 305 may be, for example, silicon nitride, silicon oxide nitride, silicon oxynitride, the like, or a combination thereof. The second dielectric layer 305 may be formed by, for example, chemical vapor deposition, plasma enhanced chemical vapor deposition, or other applicable deposition process. In some embodiments, the second dielectric layer 305 may serve as a barrier layer to prevent moisture entering the underlying layers (e.g., the first dielectric layer 303 and the third substrate 301). In some embodiments, the thickness T1 of the first dielectric layer 303 is greater than the thickness T2 of the second dielectric layer 305.

With reference to FIG. 15, a layer of second material 503 may be formed on the second dielectric layer 305. The second material 503 may be, for example, titanium, titanium nitride, tantalum, tantalum nitride, or the like. The layer of second material 503 may be formed by, for example, chemical vapor deposition, physical vapor deposition, sputtering, or the like. A layer of third material 505 may be formed on the layer of second material 503. The third material 505 may be, for example, copper, a copper alloy, silver, gold, tungsten, aluminum, nickel, or the like. The layer of third material 505 may be formed by, for example, physical vapor deposition, sputtering, or the like. A layer of fourth material 507 may be formed on the layer of third material 505. In some embodiments, the fourth material 507 and the second material 503 may include the same material. In some embodiments, the fourth material 507 may be, for example, titanium, titanium nitride, tantalum, tantalum nitride, or the like. The layer of fourth material 507 may be formed by, for example, chemical vapor deposition, physical vapor deposition, sputtering, or the like.

With reference to FIG. 15, a second mask layer 603 may be formed on the layer of fourth material 507. The second mask layer 603 may be a photoresist layer and may include the pattern of the plurality of second conductive features 313.

Figure 16:
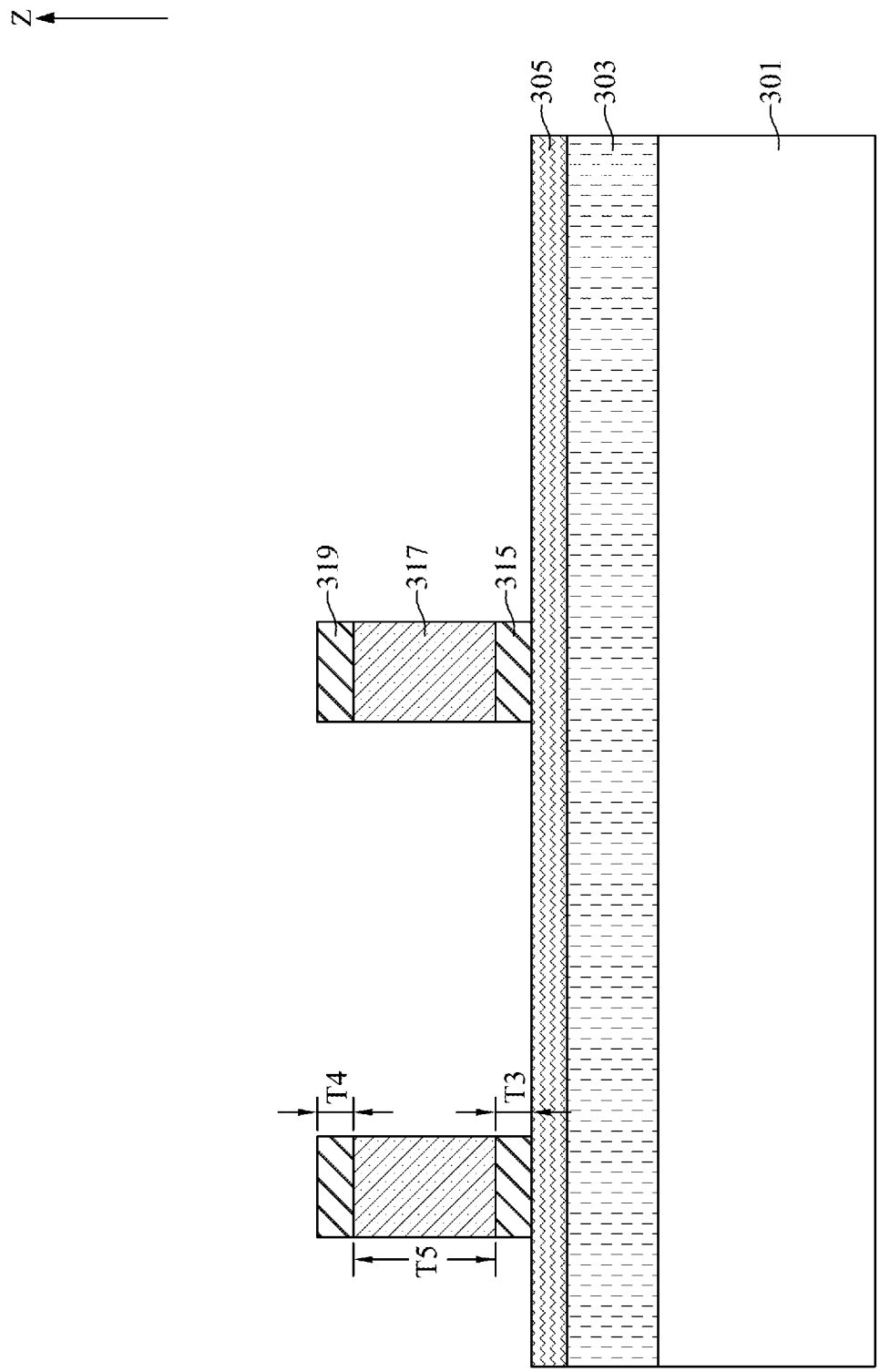

With reference to FIG. 16, an etch process, such as an anisotropic dry etch process, may be performed to remove portions of the second material 503, the third material 505, and the fourth material 507. After the etch process, the remaining second material 503 may be referred to as a plurality of bottom barrier layers 315, the remaining third material 505 may be referred to as a plurality of middle conductive layers 317, and the remaining fourth material 507 may be referred to as a plurality of the top barrier layers 319. In some embodiments, the etch process may be a multi-step etch process and may be anisotropic.

For brevity, clarity, and convenience of description, only one bottom barrier layer 315, one middle conductive layer 317, and one top barrier layer 319 are described. In some embodiments, the thickness T3 of the bottom barrier layer 315 and the thickness T4 of the top barrier layer 319 may be about the same. In some embodiments, the thickness T3 of the bottom barrier layer 315 may be greater than the thickness T4 of the top barrier layer 319. In some embodiments, the thickness T5 of the middle conductive layer 317 may be greater than the thickness T3 of the bottom barrier layer 315 or the thickness T4 of the top barrier layer 319.

Figure 17:
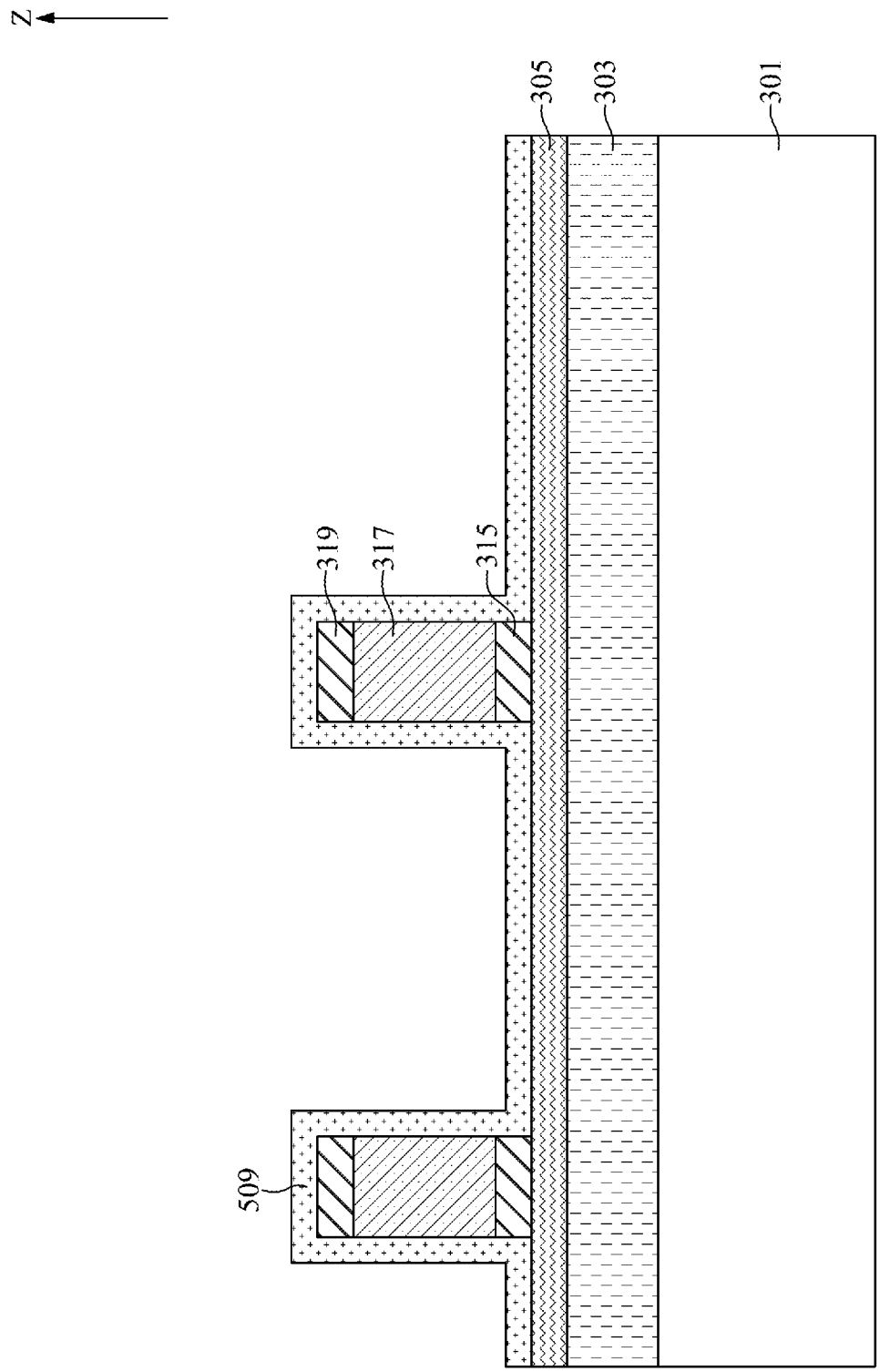

With reference to FIG. 17, a layer of fifth material 509 may be conformally formed over the intermediate semiconductor device illustrated in FIG. 16. The fifth material 509 may be, for example, titanium, titanium nitride, tantalum, tantalum nitride, or the like. The layer of fourth material 507 may be formed by, for example, atomic layer deposition, chemical vapor deposition, physical vapor deposition, sputtering, or the like. In some embodiments, the fifth material 509 and the top barrier layer 319 may include the same material.

Figure 18:
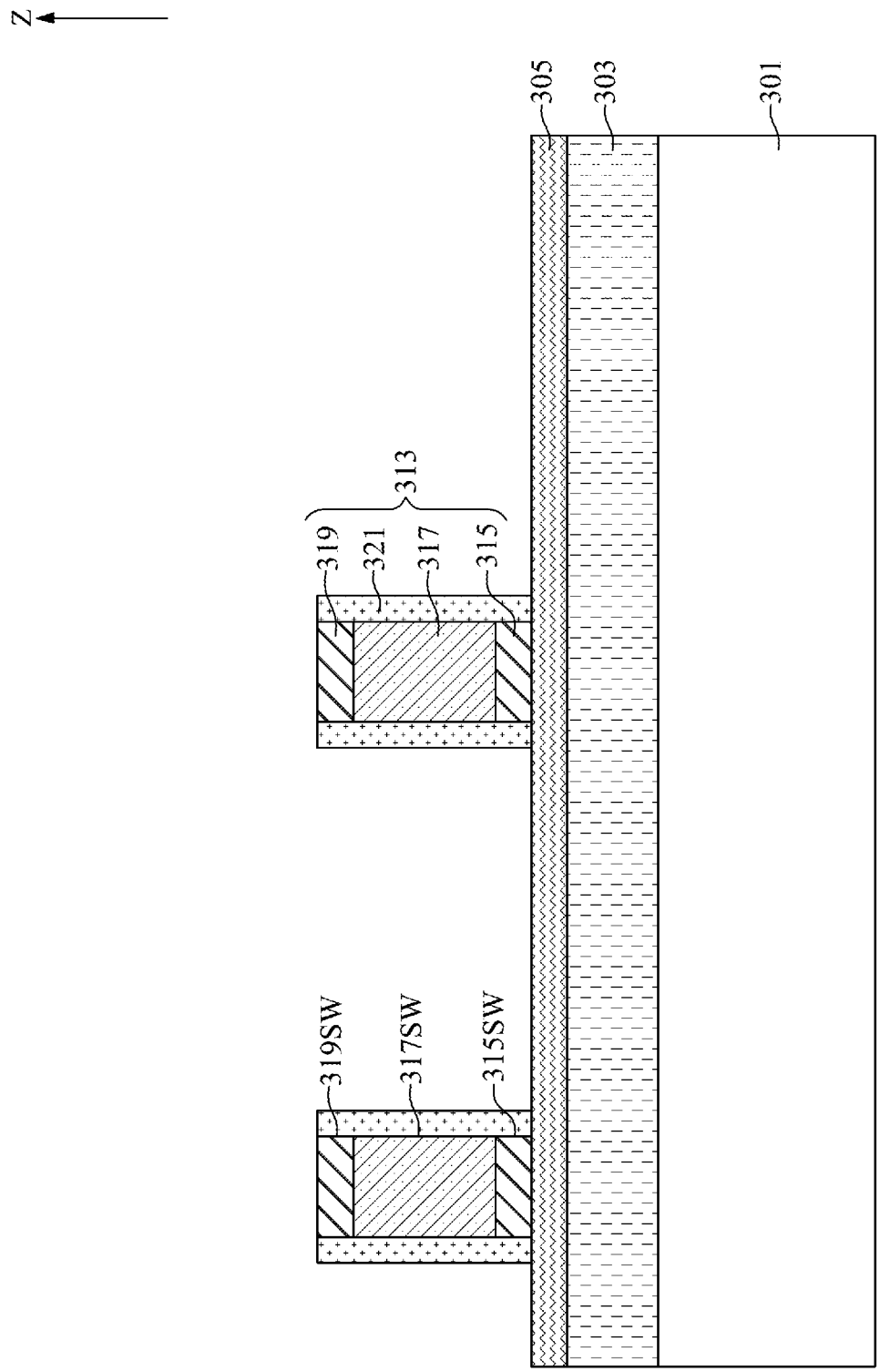

With reference to FIG. 18, an etch process, such as an anisotropic dry etch process, may be performed to remove portions of the fifth material 509. After the etch process, the remaining fifth material 509 may be referred to as a plurality of spacer barrier layers 321. The plurality of spacer barrier layers 321 may be formed to cover the sidewalls 319SW of the top barrier layer 319, the sidewalls 317SW of the middle conductive layer 317, and the sidewalls 315 SW of the bottom barrier layer 315.

The plurality of spacer barrier layers 321, the plurality of top barrier layers 319, the plurality of middle conductive layers 317, and the plurality of bottom barrier layers 315 together configure the plurality of second conductive features 313.

With reference to FIG. 14 and FIGS. 19 to 22, at step S23, a middle dielectric layer 307 may be formed on the second dielectric layer 305 and surrounding the plurality of second conductive features 313, and a plurality of decoupling features 323 may be formed in the middle dielectric layer 307.

Figure 19:
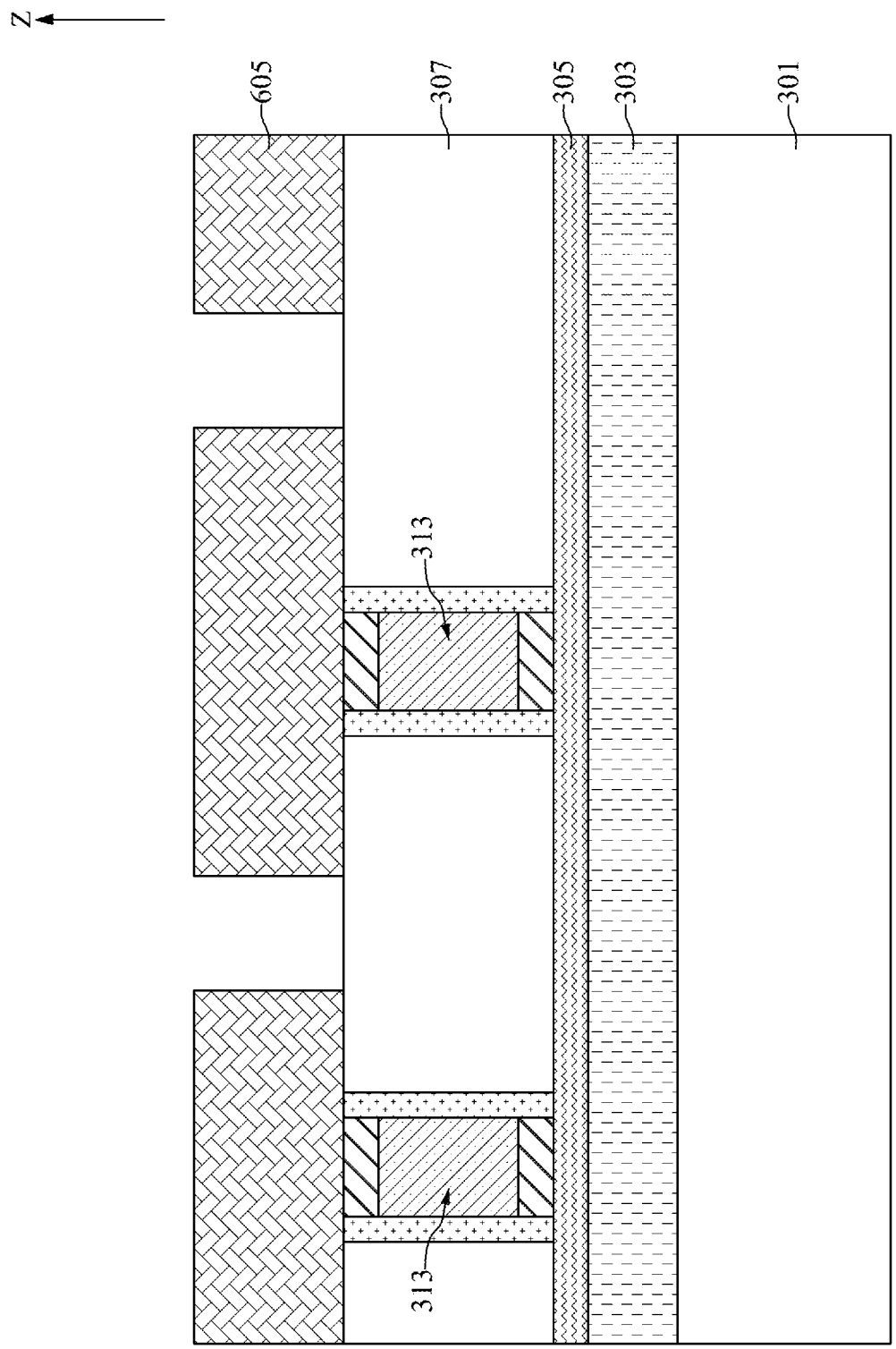

With reference to FIG. 19, the middle dielectric layer 307 may be formed on the second dielectric layer 305 and cover the plurality of second conductive features 313. A planarization process, such as chemical mechanical polishing, may be performed until the top surfaces of the plurality of second conductive features 313 are exposed to remove excess material and provide a substantially flat surface for subsequent processing steps. In some embodiments, the middle dielectric layer 307 may be formed of a material having different etching rate with respective to the second dielectric layer 305. In some embodiments, the middle dielectric layer 307 may be formed of, for example, silicon oxide, silicon nitride, silicon oxynitride, silicon nitride oxide, fluorosilicate glass, borophosphosilicate glass, or a combination thereof. In some embodiments, the middle dielectric layer 307 may be formed by, for example, chemical vapor deposition, plasma enhanced chemical vapor deposition, or other applicable deposition process.

It should be noted that, in the description of the present disclosure, a surface of an element (or a feature) located at the highest vertical level along the direction Z is referred to as a top surface of the element (or the feature). A surface of an element (or a feature) located at the lowest vertical level along the direction Z is referred to as a bottom surface of the element (or the feature).

With reference to FIG. 19, a third mask layer 605 may be formed on the middle dielectric layer 307. In some embodiments, the third mask layer 605 may be a photoresist layer and may include the pattern of the plurality of decoupling features 323.

Figure 20:
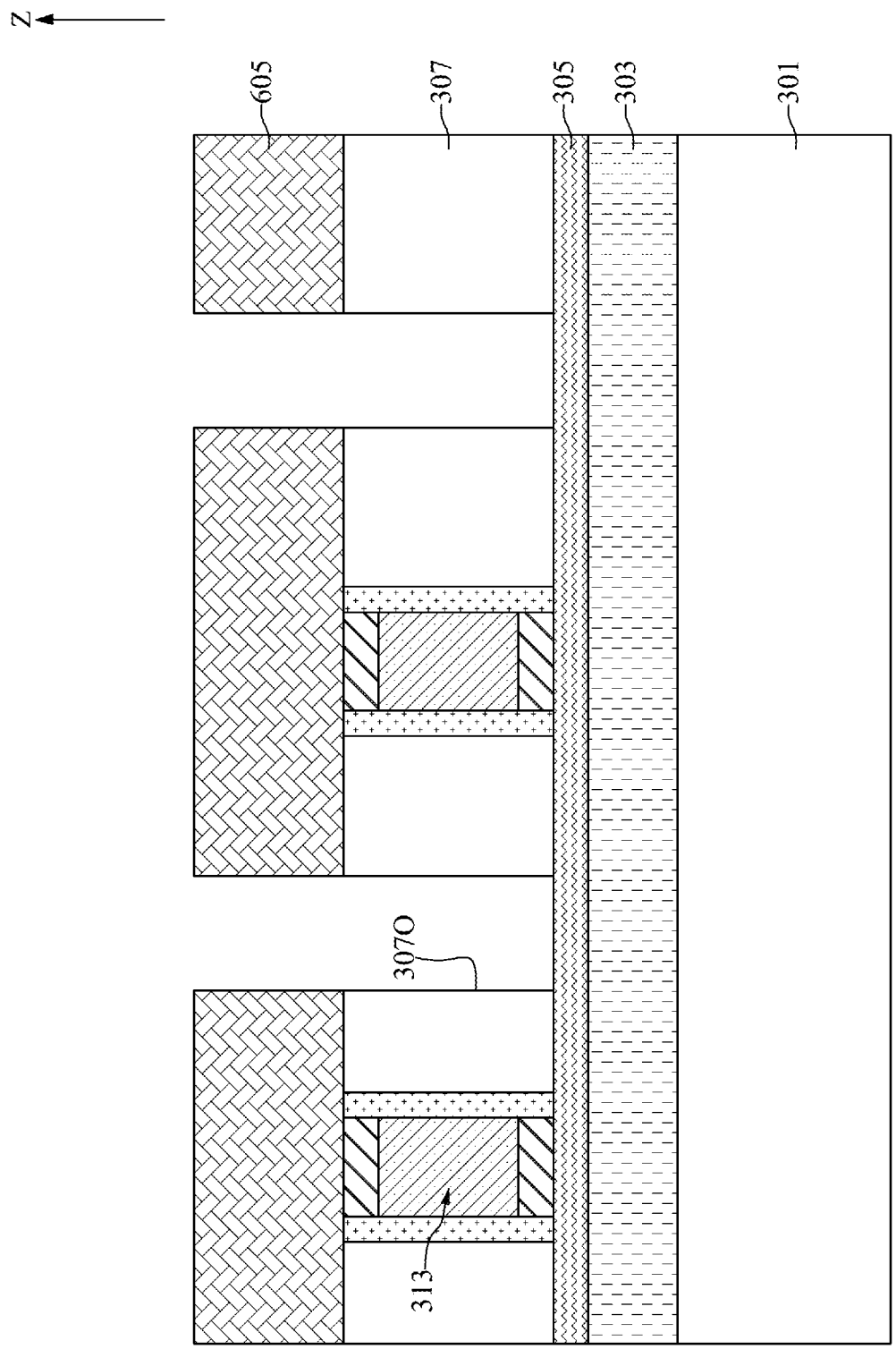

With reference to FIG. 20, an anisotropic etch process may be performed to removed portions of the middle dielectric layer 307 and concurrently form a plurality of openings 3070. In some embodiments, the anisotropic etch process may be an anisotropic dry etching process. In some embodiments, the etch rate ratio of the middle dielectric layer 307 to the second dielectric layer 305 may be between about 100:1 and about 1.05:1, between about 15:1 and about 2:1, or between about 10:1 and about 2:1 during the anisotropic etch process.

Figure 21:
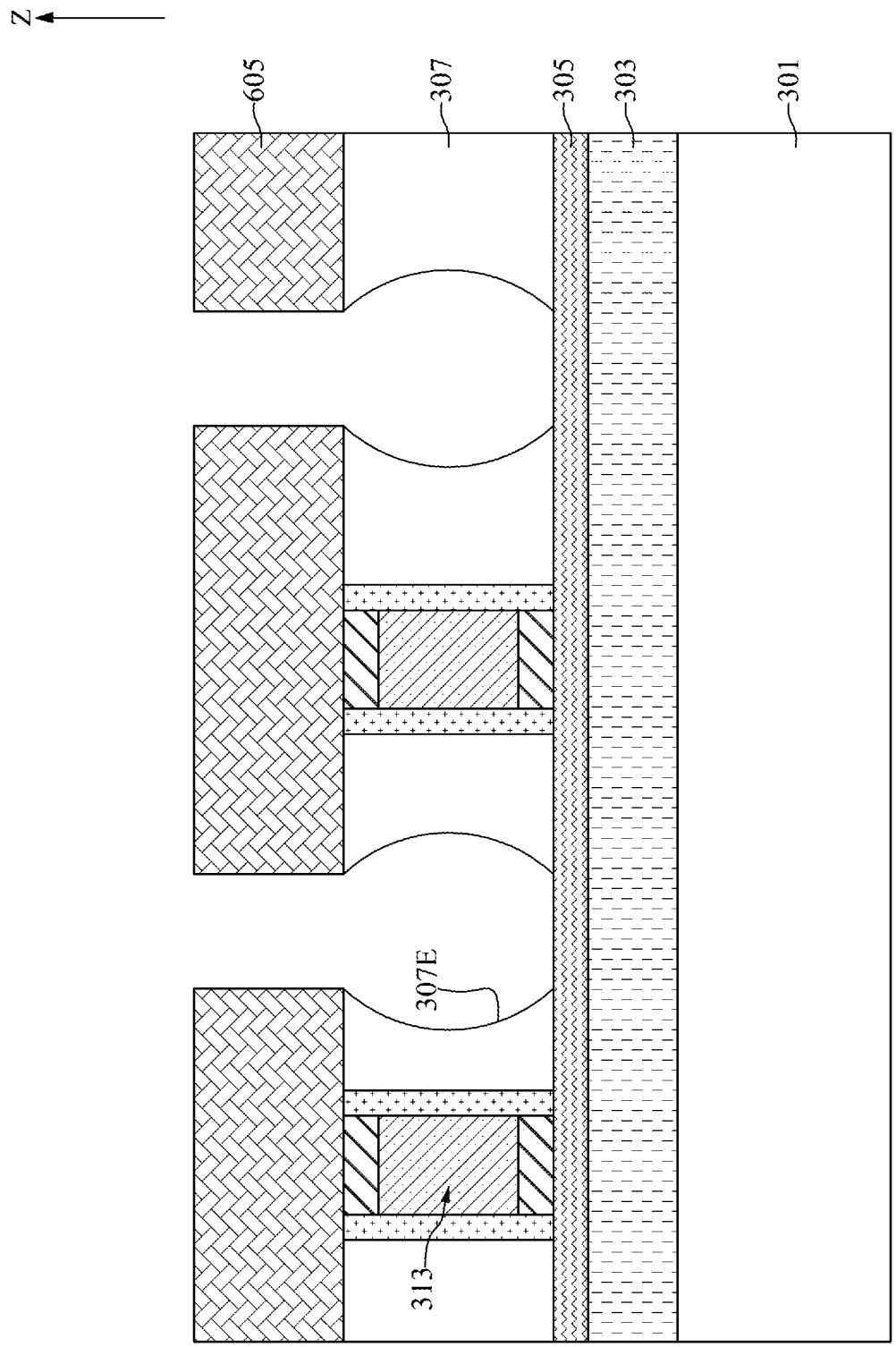

With reference to FIG. 21, an expansion etch process may be performed to expand the plurality of openings 3070 into a plurality of expanded openings 307E. In some embodiments, the expansion etch process may be an isotropic etch process. In some embodiments, the expansion etch process may be a wet etch process. In some embodiments, the etch rate ratio of the middle dielectric layer 307 to the second dielectric layer 305 may be between about 100:1 and about 1.05:1, between about 15:1 and about 2:1, or between about 10:1 and about 2:1 during the expansion etch process. In some embodiments, the sidewalls of the plurality of expanded openings 307E may be curved.

Figure 22:
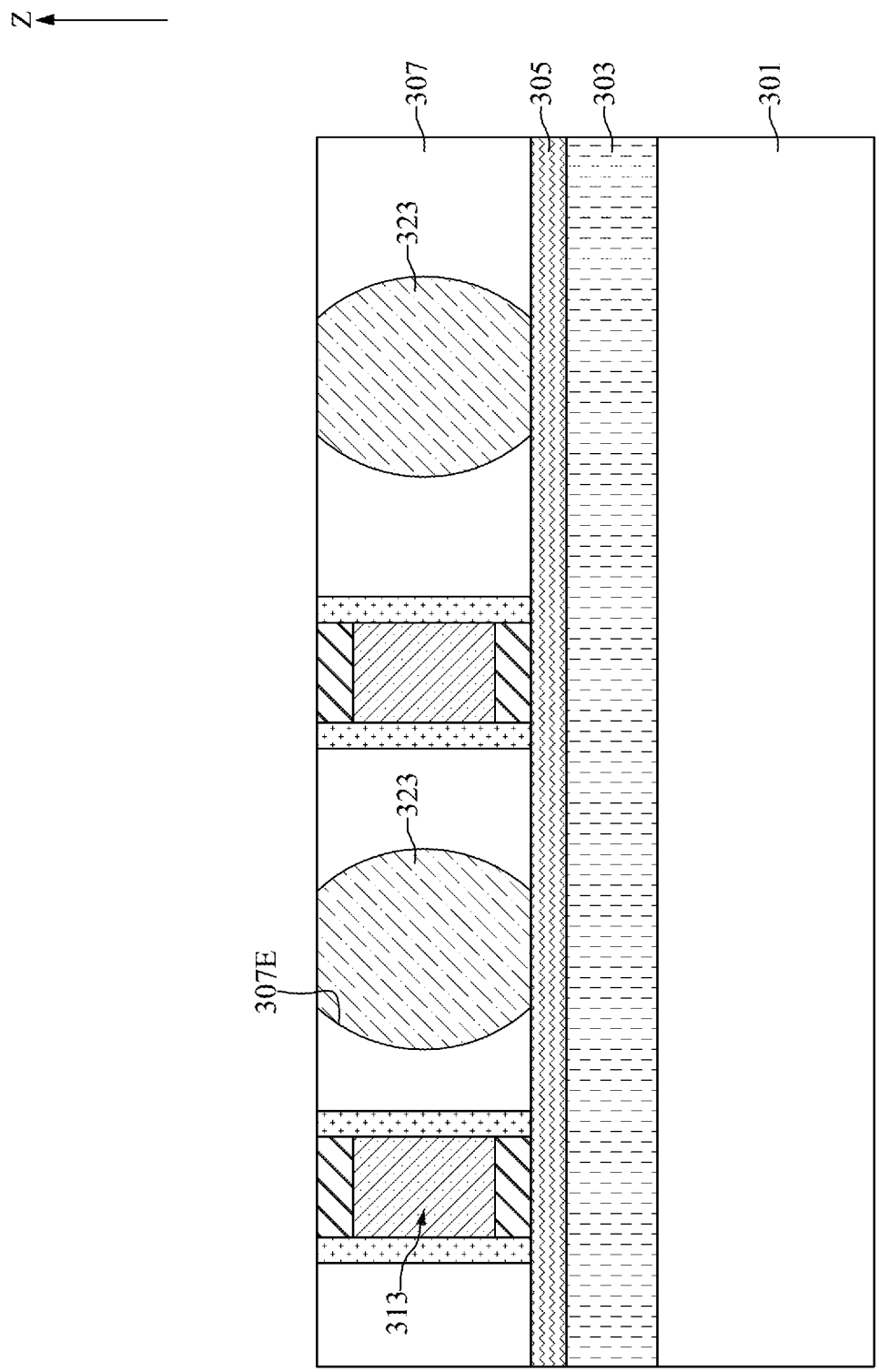

With reference to FIG. 22, the third mask layer 605 may be removed, an insulating material may be deposited to completely fill the plurality of expanded openings 307E, and a planarization process, such as chemical mechanical polishing, may be subsequently performed until the top surfaces of the plurality of second conductive features 313 are exposed to remove excess material, provide a substantially flat surface for subsequent processing steps, and concurrently form the plurality of decoupling features 323. In some embodiments, the plurality of decoupling features 323 may have bottle-shaped cross-sectional profiles.

In some embodiments, the insulating material may be, for example, a porous low-k material.

In some embodiments, the insulating material may be an energy-removable material. The energy-removable material may include a material such as a thermal decomposable material, a photonic decomposable material, an e-beam decomposable material, or a combination thereof. For example, the energy-removable material may include a base material and a decomposable porogen material that is sacrificially removed upon being exposed to an energy source. The base material may include a methylsilsesquioxane based material. The decomposable porogen material may include a porogen organic compound that provides porosity to the base material of the energy-removable material. An energy treatment may be performed after the planarization process by applying an energy source. The energy source may include heat, light, or a combination thereof. When heat is used as the energy source, a temperature of the energy treatment may be between about 800° C. and about 900° C. When light is used as the energy source, an ultraviolet light may be applied. The energy treatment may remove the decomposable porogen material from the energy-removable material to generate empty spaces (pores), with the base material remaining in place. The empty spaces (pores) may reduce the dielectric constant of the plurality of decoupling features 323.

With reference to FIG. 22, the plurality of decoupling features 323 may be formed between the adjacent pairs of the plurality of second conductive features 313, respectively and correspondingly. In some embodiments, the plurality of decoupling features 323 having low dielectric constant may implement decoupling function. In some embodiments, the plurality of decoupling features 323 may reduce parasitic capacitance of the plurality of second conductive features 313.

With reference to FIG. 14 and FIGS. 23 to 25, at step S25, a third dielectric layer 309 may be formed on the middle dielectric layer 307, a fourth dielectric layer 311 may be formed on the third dielectric layer 309, and a plurality of third alignment marks 325 may be formed on the plurality of decoupling features 323.

Figure 23:
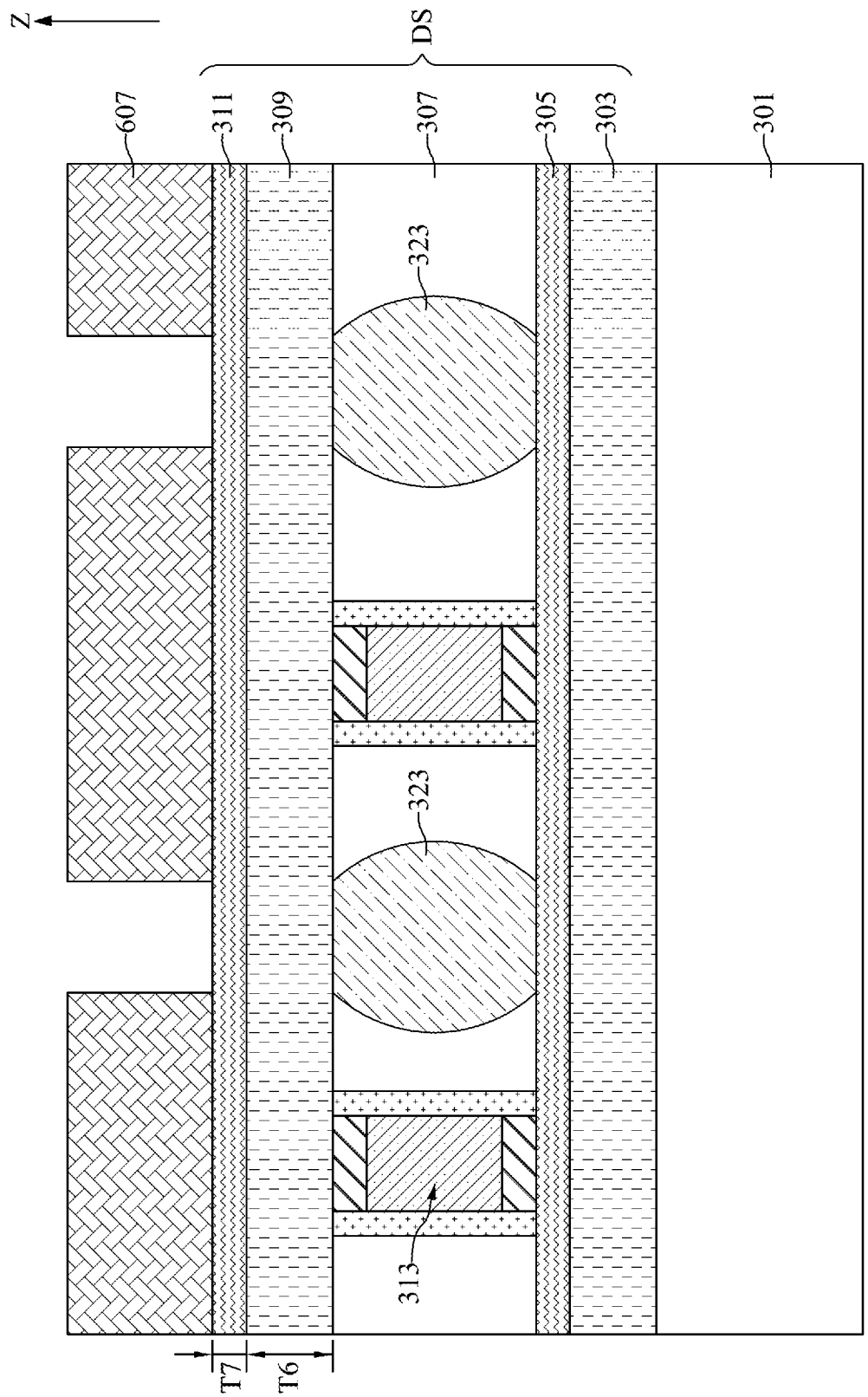

With reference to FIG. 23, in some embodiments, the third dielectric layer 309 may be formed of, for example, fluorosilicate glass, borophosphosilicate glass, a spin-on low-k dielectric layer, a chemical vapor deposition low-k dielectric layer, or a combination thereof. In some embodiments, the third dielectric layer 309 may include a self-planarizing material such as a spin-on glass or a spin-on low-k dielectric material such as SiLK™. The use of a self-planarizing dielectric material may avoid the need to perform a subsequent planarizing step. In some embodiments, the third dielectric layer 309 may be formed by a deposition process including, for example, chemical vapor deposition, plasma enhanced chemical vapor deposition, evaporation, or spin-on coating. In some embodiments, the third dielectric layer 309 and the first dielectric layer 303 may be formed of the same material.

With reference to FIG. 23, in some embodiments, the fourth dielectric layer 311 may be, for example, silicon nitride, silicon oxide nitride, silicon oxynitride, the like, or a combination thereof. The fourth dielectric layer 311 may be formed by, for example, chemical vapor deposition, plasma enhanced chemical vapor deposition, or other applicable deposition process. In some embodiments, the fourth dielectric layer 311 may serve as a barrier layer to prevent moisture entering the underlying layers (e.g., the third dielectric layer 309 and the middle dielectric layer 307). In some embodiments, the thickness T6 of the third dielectric layer 309 is greater than the thickness T7 of the fourth dielectric layer 311.

With reference to FIG. 23, the first dielectric layer 303, the second dielectric layer 305, the middle dielectric layer 307, the third dielectric layer 309, and the fourth dielectric layer 311 may together configure a dielectric stack DS.

With reference to FIG. 23, a fourth mask layer 607 may be formed on the dielectric stack DS. The fourth mask layer 607 may be a photoresist layer and may include the pattern of the plurality of third alignment marks 325.

Figure 24:
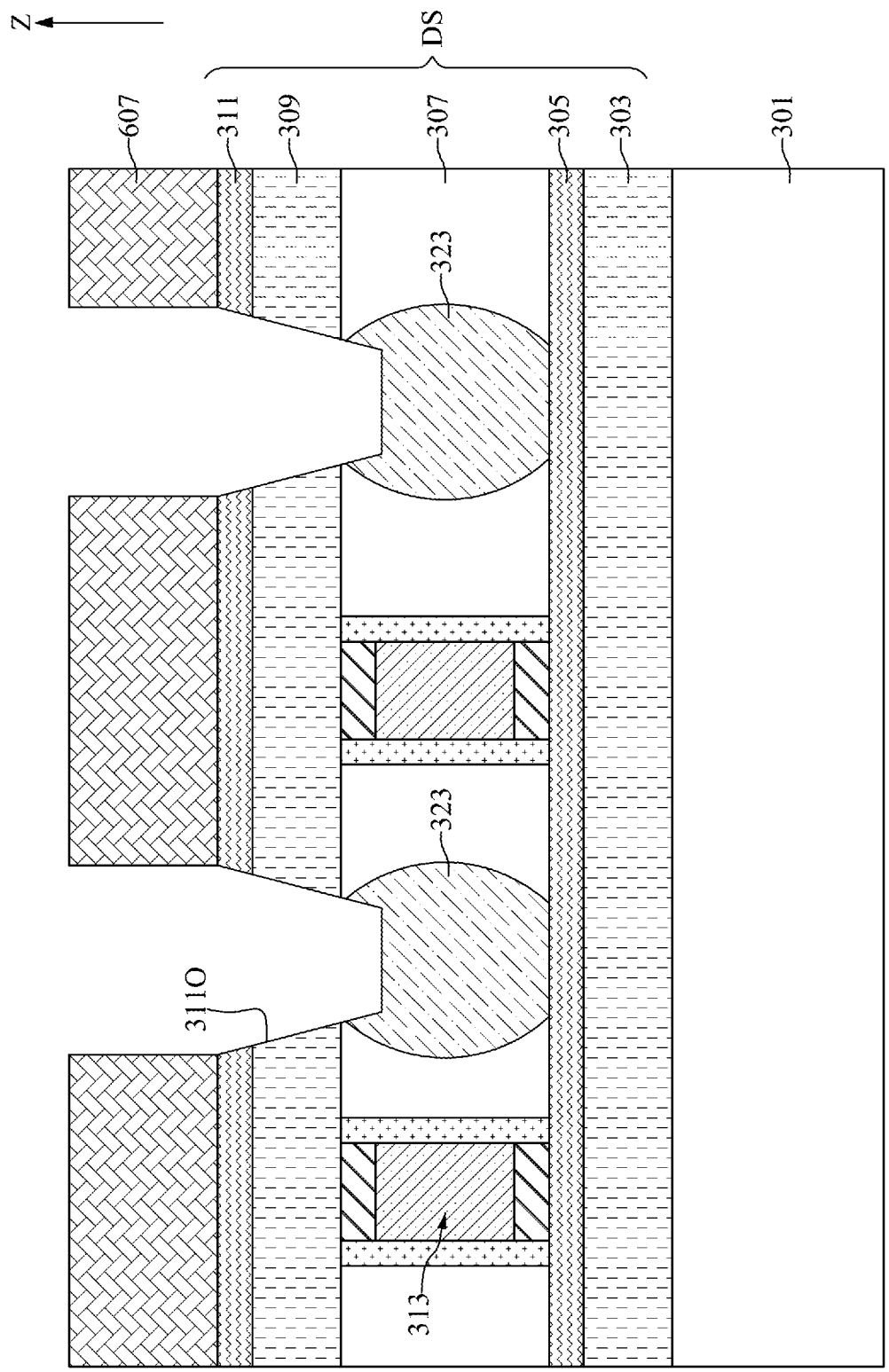

With reference to FIG. 24, an etch process, such as an anisotropic dry etch process, may be performed to remove portions of the fourth dielectric layer 311, portions of the third dielectric layer 309, and portions of the plurality of decoupling features 323 to form a plurality of mark openings 3110. The sidewalls of the plurality of mark openings 3110 may be tapered.

Figure 25:
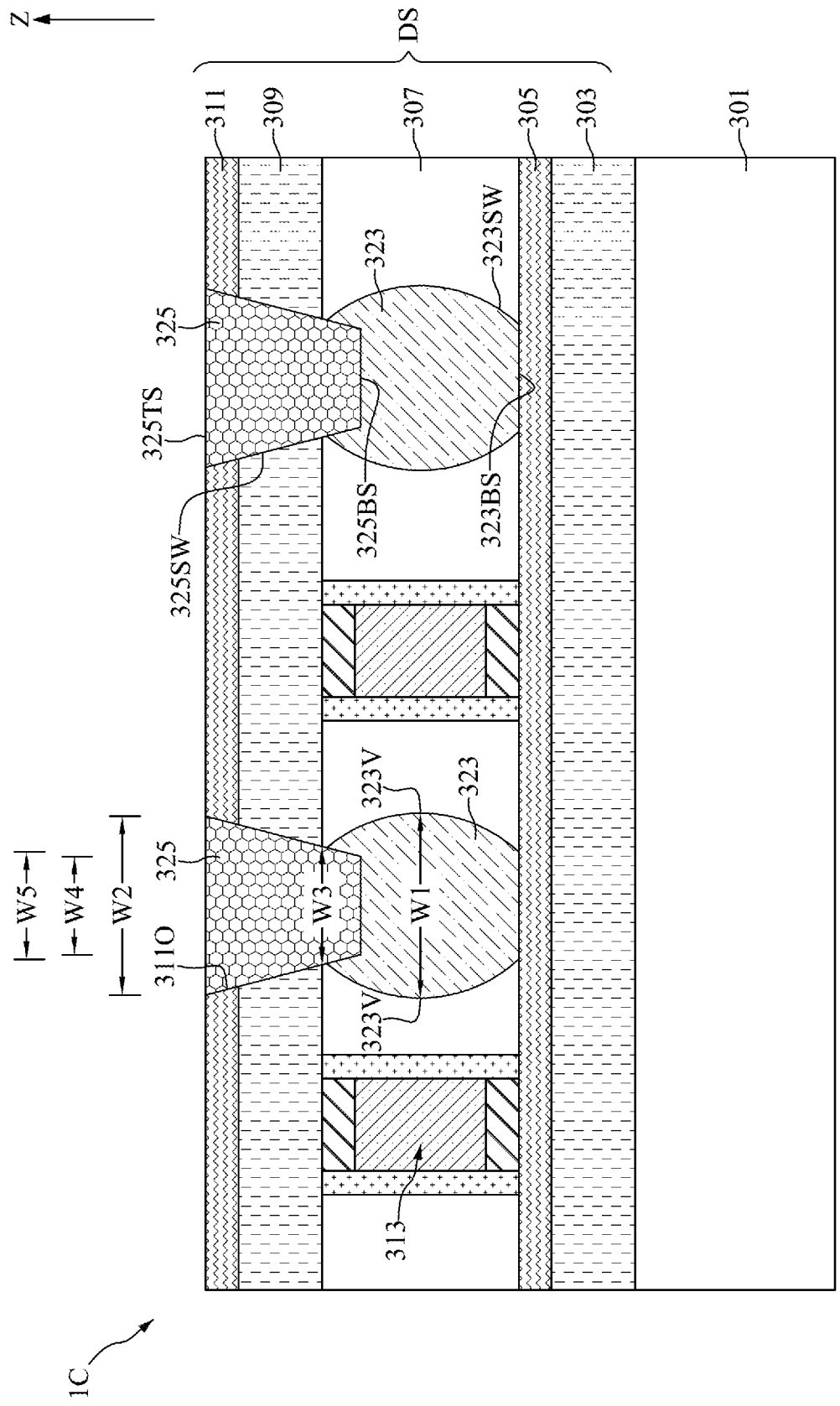

With reference to FIG. 25, an insulating layer may be formed to completely fill the plurality of mark openings 3110. The insulating layer may include a fluorescence material. In some embodiments, the fluorescence material may be azobenzene. In some embodiments, the insulating layer may be formed by, for example, chemical vapor deposition. A planarization process, such as chemical mechanical polishing, may be performed until the fourth dielectric layer 311 is exposed to remove excess material, provide a substantially flat surface for subsequent processing steps, and concurrently turn the insulating layer into the plurality of third alignment marks 325. Due to the profile of the plurality of third alignment marks 325 are determined by the plurality of mark openings 3110. The sidewalls 325 SW of the plurality of third alignment marks 325 may be tapered.

For brevity, clarity, and convenience of description, only one decoupling feature 323 and one third alignment mark 325 are described.

In some embodiments, the width W1 between the two valleys 323V of the sidewalls 323SW of the decoupling feature 323 may be greater than the width W2 of the top surface 325TS of the third alignment mark 325. In some embodiments, the width W2 of the top surface 325TS of the third alignment mark 325 may be greater than the width W3 of the third alignment mark 325 at the interface between the middle dielectric layer 307 and the third dielectric layer 309. In some embodiments, the width W3 of the third alignment mark 325 at the interface between the middle dielectric layer 307 and the third dielectric layer 309 may be greater than the width W4 of the bottom surface 325BS of the third alignment mark 325. In some embodiments, the width W3 of the third alignment mark 325 at the interface between the middle dielectric layer 307 and the third dielectric layer 309 may be greater than the width W5 of the bottom surface 323BS of the decoupling feature 323. In some embodiments, the width ratio between the width W1 and the width W5 may be between about 1.5:1 and about 1.1:1 or between about 1.3:1 and about 1.1:1.

The plurality of third alignment marks 325 including fluorescence material may improve optical recognition during following wafer bonding process.

Figure 26:
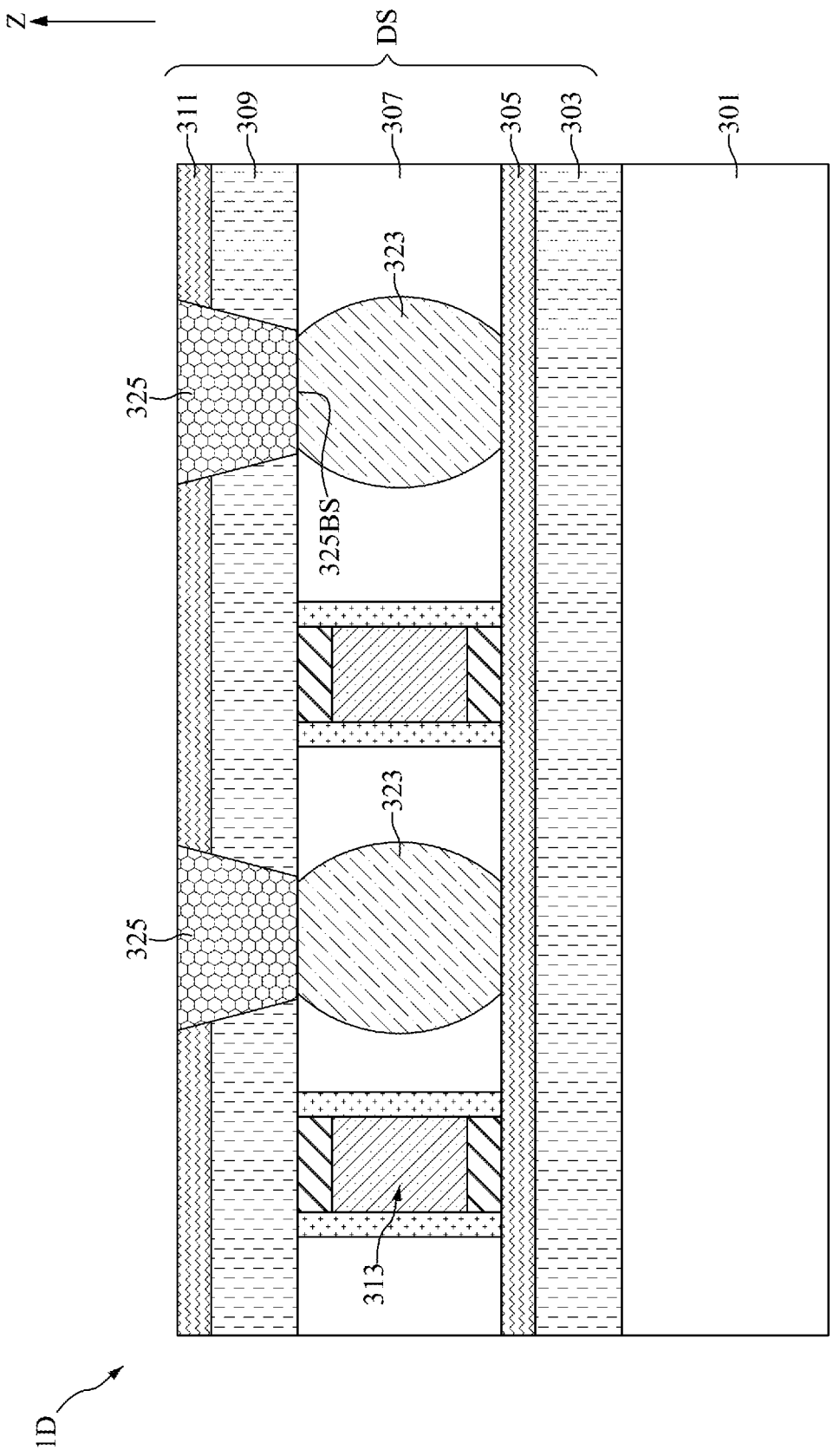
FIG. 26 illustrates, in a schematic cross-sectional view diagram, a semiconductor device in accordance with another embodiment of the present disclosure.

FIG. 26 illustrates, in a schematic cross-sectional view diagram, a semiconductor device in accordance with another embodiment of the present disclosure.

With reference to FIG. 26, the semiconductor device 1D may have a structure similar to that illustrated in FIG. 25. The same or similar elements in FIG. 26 as in FIG. 25 have been marked with similar reference numbers and duplicative descriptions have been omitted.

In the semiconductor device 1D, the bottom surface 325BS of the third alignment mark 325 may be disposed on the decoupling feature 323 instead of extending to the decoupling feature 323.

One aspect of the present disclosure provides a semiconductor device including a first wafer comprising a first substrate and a plurality of first alignment marks positioned on the first substrate and parallel to each other; and a second wafer positioned on the first wafer and comprising a plurality of second alignment marks positioned above the plurality of first alignment marks. The plurality of second alignment marks are arranged parallel to the plurality of first alignment marks and adjacent to the plurality of first alignment marks in a top-view perspective. The plurality of first alignment marks and the plurality of second alignment marks comprise a fluorescence material. The plurality of first alignment marks and the plurality of second alignment marks together configure a first set of alignment marks.

Another aspect of the present disclosure provides a semiconductor device including a substrate; a dielectric stack positioned on the substrate; two conductive features positioned in the dielectric stack; a decoupling feature positioned in the dielectric stack, between the two second conductive features, and comprising a bottle-shaped cross-sectional profile; and an alignment mark positioned on the decoupling feature. The alignment mark comprises a fluorescence material.

Another aspect of the present disclosure provides a method for fabricating a semiconductor device including providing a first substrate; forming a plurality of first alignment marks on the first substrate and parallel to each other, wherein the first substrate and the plurality of first alignment marks together configure a first wafer; providing a second wafer comprising a plurality of second alignment marks parallel to each other; and bonding the second wafer onto the first wafer. The plurality of second alignment marks are arranged parallel to the plurality of first alignment marks and adjacent to the plurality of first alignment marks in a top-view perspective. The plurality of first alignment marks and the plurality of second alignment marks comprise a fluorescence material.

Another aspect of the present disclosure provides a method for fabricating a semiconductor device including providing a substrate; forming a first dielectric layer on the substrate; forming a second dielectric layer on the first dielectric layer; forming two second conductive features on the second dielectric layer; forming a middle dielectric layer on the second dielectric layer and surrounding the two second conductive features; performing an expansion etch process to form an expanded opening in the middle dielectric layer; forming a decoupling feature in the expanded opening; and forming an alignment mark on the decoupling feature. The alignment mark comprises a fluorescence material.

Due to the design of the semiconductor device of the present disclosure, the plurality of alignment marks 105, 205, 325 including fluorescence material may improve optical recognition during wafer bonding process. In addition, the complementary design makes the plurality of first alignment marks 105 and the plurality of second alignment marks 205 become references for each other during the bonding process. As a result, the yield and reliability of the semiconductor device 1A may be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:
    a first wafer comprising:
        a first substrate; and
        a plurality of first alignment marks positioned on the first substrate and parallel to each other; and
        a decoupling feature positioned in dielectric stack under one of the plurality of first alignment marks, and having a bottle-shaped cross-sectional profile, wherein the decoupling feature comprises a porous low-k material;
    a second wafer positioned on the first wafer and comprising:
        a plurality of second alignment marks positioned above the plurality of first alignment marks;
    wherein the plurality of second alignment marks are arranged parallel to the plurality of first alignment marks and adjacent to the plurality of first alignment marks in a top-view perspective;
    wherein the plurality of first alignment marks and the plurality of second alignment marks comprise a fluorescent material;
    wherein the plurality of first alignment marks and the plurality of second alignment marks together configure a first set of alignment marks.

2. The semiconductor device of claim 1, wherein the fluorescent material comprises azobenzene.

3. The semiconductor device of claim 2, further comprising a second set of alignment marks separated from the first set of alignment marks along a first direction;
    wherein the first set of alignment marks is extending along a second direction perpendicular to the first direction, and the second set of alignment marks is extending along the first direction.

4. The semiconductor device of claim 3, further comprising a third set of alignment marks separated from the first set of alignment marks along the second direction;
    wherein the third set of alignment marks is extending along the first direction.

5. The semiconductor device of claim 4, further comprising a fourth set of alignment marks separated from the first set of alignment marks along a direction slanted with respective to the first direction and the second direction;
    wherein the fourth set of alignment marks is extending along the second direction.

6. The semiconductor device of claim 4, further comprising a fifth set of alignment marks separated from the first set of alignment marks along a direction slanted with respective to the first direction and the second direction;
    wherein the fifth set of alignment marks is extending along the first direction.

7. The semiconductor device of claim 2, wherein the first wafer comprises a plurality of first conductive features horizontally surrounding the plurality of first alignment marks.

8. The semiconductor device of claim 7, wherein the first wafer comprises a first bottom liner positioned between the plurality of first conductive features and the plurality of first alignment marks.

9. The semiconductor device of claim 8, wherein the first wafer comprises a first top liner positioned on the plurality of first alignment marks and on the first bottom liner.

10. The semiconductor device of claim 9, wherein the second wafer comprises a second top liner positioned between the plurality of second alignment marks and the first top liner.

11. The semiconductor device of claim 10, wherein the second wafer comprises a plurality of second conductive features horizontally surrounding the plurality of second alignment marks and on the second top liner.

12. The semiconductor device of claim 11, wherein the second wafer comprises a second bottom liner positioned between the plurality of second alignment marks and the plurality of second conductive features, and between the plurality of second conductive features and the second top liner.

13. The semiconductor device of claim 2, wherein the first wafer is configured as logic chips and the second wafer is configured as memory chips.

14. The semiconductor device of claim 2, wherein the first wafer is configured as memory chips and the second wafer is configured as memory chips.

15. The semiconductor device of claim 1, wherein the dielectric stack comprises a first dielectric layer positioned on the substrate, a second dielectric layer positioned on the first dielectric layer, a middle dielectric layer positioned on the second dielectric layer, a third dielectric layer positioned on the middle dielectric layer, and a fourth dielectric layer positioned on the third dielectric layer, and the two second conductive features and the decoupling feature are positioned in the middle dielectric layer.

16. The semiconductor device of claim 15, wherein the third alignment mark is positioned along the fourth dielectric layer and the third dielectric layer, and is positioned on the decoupling feature.

17. The semiconductor device of claim 15, wherein the third alignment mark is positioned along the fourth dielectric layer and the third dielectric layer, and extends to the decoupling feature.

18. The semiconductor device of claim 15, wherein a width between two valleys of sidewalls of the decoupling feature is greater than a width of a top surface of the third alignment mark.

* * * * *